(12) United States Patent
Okigawa et al.

(10) Patent No.: US 11,855,135 B2
(45) Date of Patent: Dec. 26, 2023

(54) SEMICONDUCTOR DEVICE

(71) Applicant: FLOSFIA INC., Kyoto (JP)

(72) Inventors: Mitsuru Okigawa, Kyoto (JP);
Hideaki Yanagida, Kyoto (JP);
Takashi Shinohe, Kyoto (JP)

(73) Assignee: FLOSFIA INC., Kyoto (JP)

( * ) Notice: Subject to any disclaimer, the term of this patent is extended or adjusted under 35 U.S.C. 154(b) by 176 days.

(21) Appl. No.: 17/508,259

(22) Filed: Oct. 22, 2021

(65) Prior Publication Data
US 2022/0130952 A1    Apr. 28, 2022

(30) Foreign Application Priority Data

Oct. 23, 2020 (JP) ................................. 2020-178409

(51) Int. Cl.
*H01L 29/06* (2006.01)
*H01L 29/24* (2006.01)
*H01L 29/78* (2006.01)
*H01L 29/66* (2006.01)
(Continued)

(52) U.S. Cl.
CPC .......... *H01L 29/0623* (2013.01); *H01L 29/24* (2013.01); *H01L 29/66969* (2013.01); *H01L 29/7802* (2013.01); *H01L 29/872* (2013.01); *H02P 27/06* (2013.01)

(58) Field of Classification Search
None
See application file for complete search history.

(56) References Cited

U.S. PATENT DOCUMENTS

| 2008/0142795 A1 | 6/2008 | Ichinose et al. |
| 2015/0194479 A1 | 7/2015 | Kaneko et al. |
| 2022/0130952 A1* | 4/2022 | Okigawa ................. H01L 29/24 |

FOREIGN PATENT DOCUMENTS

| JP | 2005-260101 | 9/2005 |
| JP | 2009-081468 | 4/2009 |
| JP | 2012-129299 | 7/2012 |

(Continued)

OTHER PUBLICATIONS

International Search Report dated Sep. 1, 2020 in International (PCT) Application No. PCT/JP2020/020428.

(Continued)

*Primary Examiner* — Jack S Chen
(74) *Attorney, Agent, or Firm* — Wenderoth, Lind & Ponack, L.L.P.

(57) ABSTRACT

An object of the disclosure is to provide a semiconductor device having enhanced adhesion of the electrode while improving the reverse direction breakdown voltage, which is especially useful for power devices. A semiconductor device including a semiconductor layer and an electrode layer provided on the semiconductor layer and including at least a first electrode layer and a second electrode layer provided on the first electrode layer, wherein an outer edge portion of the second electrode layer is located outside an outer edge portion of the first electrode layer, wherein the semiconductor layer includes an electric field relaxation region with a different electrical resistivity from that of the semiconductor layer, and wherein the electric field relaxation region overlaps at least a part of a portion of the second electrode layer located outside the outer edge portion of the first electrode layer in plan view.

21 Claims, 16 Drawing Sheets

(51) Int. Cl.
 H01L 29/872 (2006.01)
 H02P 27/06 (2006.01)

(56) References Cited

FOREIGN PATENT DOCUMENTS

| | | |
|---|---|---|
| JP | 2013-012760 | 1/2013 |
| JP | 2015-2043 31 | 11/2015 |
| WO | 2014/050793 | 4/2014 |

OTHER PUBLICATIONS

International Search Report dated Sep. 8, 2020 in International (PCT) Application No. PCT/JP2020/020429.
International Search Report dated Oct. 20, 2020 in International (PCT) Application No. PCT/JP2020/027576.
International Search Report dated Oct. 20, 2020 in International (PCT) Application No. PCT/JP2020/027577.
Jun Liang Zhao et al., "UV and Visible Electroluminescence From a Sn:$Ga_2O_3$/$n^+$-Si Heterojunction by Metal-Organic Chemical Vapor Deposition", IEEE Transactions on Electron Devices, vol. 58, No. 5, pp. 1447-1451, May 2011.
Kohei Sasaki et al., "Si-Ion Implantation Doping in β$Ga_2O_3$ and Its Application to Fabrication of Low-Resistance Ohmic Contacts", Applied Physics Express 6 (2013) 086502, pp. 086502-1-086502-4.

\* cited by examiner

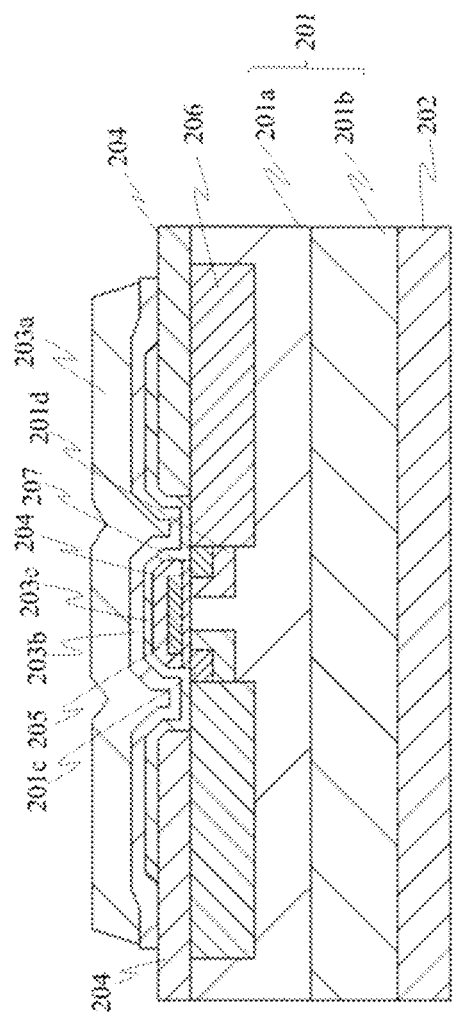

SEMICONDUCTOR DEVICE

The disclosure relates to a semiconductor device applicable to a power device or the like.

BACKGROUND

Gallium oxide ($Ga_2O_3$) is a transparent semiconductor which has a wide band gap of 4.8-5.3 eV at room temperature and hardly absorbs visible and ultraviolet light. Therefore, it is particularly a promising material for use in optical devices, electronic devices and transparent electronics operating in the deep ultraviolet light region. In recent years, as disclosed in Non-Patent Document 1, photodetectors, light-emitting diodes (LEDs), and transistors using gallium oxide have been developed. Further, as disclosed in Patent Document 4, bandgap of gallium oxide can be controlled by mixing indium or aluminum, respectively, or by mixing both indium and aluminum, to constitutes a mixed crystal. Gallium oxide is extremely attractive as a InAlGaO-based semiconductor. InAlGaO-based semiconductors here indicate $In_XAl_YGa_ZO_3$ ($0 \leq X \leq 2$, $0 \leq Y \leq 2$, $0 \leq Z \leq 2$, $X+Y+Z=1.5$-$2.5$) and can be considered as a family of materials commonly containing gallium oxide.

There are five crystalline structures of gallium oxide ($Ga_2O_3$), α-type, β-type, γ-type, σ-type, and ε-type are known to exist, and $\beta$-$Ga_2O_3$ is generally the most stable structure. However, since $\beta$-$Ga_2O_3$ has a β-gallia structure, unlike the crystal systems generally used in electronic materials or the like, application in a semiconductor device is not always suitable. The growth of $\beta$-$Ga_2O_3$ thin films requires high substrate temperature and high vacuum degree, which also increases manufacturing costs. As disclosed in Non-Patent Document 2, $\beta$-$Ga_2O_3$ cannot be used as a donor only by using silicon (Si) dopants having a high concentration (e.g., $1 \times 10^{19}/cm^3$ or more), and cannot be used as a donor unless annealing treatment is performed at a high temperature of 800° C. to 1100° C. after ion implantation.

On the other hand, since $\alpha$-$Ga_2O_3$ has the same crystal structure as the sapphire substrate which has been widely provided, it is suitable for use in optical devices and electronic devices. Furthermore, $\alpha$-$Ga_2O_3$ is particularly useful for power devices due to its bandgap that is wider than that of $\beta$-$Ga_2O_3$. Therefore, a semiconductor device using $\alpha$-$Ga_2O_3$ as a semiconductor is desired.

Patent Documents 1 and 2 disclose a semiconductor device using $\beta$-$Ga_2O_3$ as a semiconductor, also using an electrode for obtaining ohmic properties conforming to $\beta$-$Ga_2O_3$ semiconductor, the electrode of two layers consisting of Ti and Au layers, the electrode of the three layers consisting of Ti, Al and Au layers, or the four layers consisting of Ti, Al, Ni and Au layers.

Patent Document 3 discloses a semiconductor device using $\beta$-$Ga_2O_3$ as a semiconductor, also using an electrode for obtaining Schottky properties conforming to $\beta$-$Ga_2O_3$ semiconductor, the electrode consisting of either Au layer, Pt layer, or a multilayer of Ni and Au layers.

However, in the case where the electrode disclosed in Patent Documents 1 to 3 is applied to a semiconductor device using $\alpha$-$Ga_2O_3$ as a semiconductor, the electrode does not function as a Schottky electrode or an ohmic electrode, or the semiconductor properties are degraded by the electrode to be peeled off from the semiconductor film. Furthermore, in the configuration of the electrode disclosed in Patent Documents 1 to 3, a leakage current is generated from the vicinity of an edge portion of the electrode, or peeling occurs from the edge portion of the electrode at the time of mounting to the product for example, so that a semiconductor device that is practically satisfactory could not be obtained.

Patent Document 1: Japanese Patent Application Publication No. 2005-260101
Patent Document 2: Japanese Patent Application Publication No. 2009-081468
Patent Document 3: Japanese Patent Application Publication No. 2013-012760
Patent Document 4: International Patent Application Publication No. 2014/050793
Non-Patent Document 1: Jun Liang Zhao et al, "UV and Visible Electroluminescence From a $Sn:Ga_2O_3/n^+$-Si Heterojunction by Metal-Organic Chemical Vapor Deposition", IEEE TRANSACTIONS ON ELECTRON DEVICES, VOL. 58, NO. 5 May 2011
Non-Patent Document 2: Kohei Sasaki et al, "Si-Ion Implantation Doping in $\beta$-$Ga_2O_3$ and Its Application to Fabrication of Low-Resistance Ohmic Contacts", Applied Physics Express 6 (2013) 086502

An object of the disclosure is to provide a semiconductor device having enhanced adhesion of the electrode while improving the reverse breakdown voltage.

SUMMARY

As a result of intensive studies to achieve the above object, inventors provide a semiconductor device including a semiconductor layer and an electrode layer provided on the semiconductor layer and including at least a first electrode layer and a second electrode layer provided on the first electrode layer, wherein an outer edge portion of the second electrode layer is located outside an outer edge portion of the first electrode layer, wherein the semiconductor layer includes an electric field relaxation region with a different electrical resistivity from that of the semiconductor layer, and wherein the electric field relaxation region overlaps at least a part of a portion of the second electrode layer located outside the outer edge portion of the first electrode layer in plan view. Such semiconductor device was found to perform improving the reverse breakdown voltage, adhesion of the electrode and mountability. In addition, the semiconductor device thus obtained can solve the above-mentioned problems.

After the above findings, the inventors have made further research and reach the disclosure.

Embodiments of the Disclosure are as Follows.

[1] A semiconductor device including a semiconductor layer, and an electrode layer provided on the semiconductor and including a first electrode layer and a second electrode layer provided on the first electrode layer, wherein an outer edge portion of the second electrode layer is located outside an outer edge portion of the first electrode layer, wherein the semiconductor layer has an electric field relaxation region with a different electrical resistivity from the semiconductor layer, and wherein the electric field relaxation region overlaps at least a part of a portion of the second electrode layer located outside the outer edge portion of the first electrode layer in a plan view.

[2] The semiconductor device according to [1], wherein the semiconductor layer includes a crystalline oxide semiconductor as a main component.

[3] The semiconductor device according to [2], wherein the crystalline oxide semiconductor contains one or more metals selected from aluminum, indium and gallium.

[4] The semiconductor device according to [2] or [3], wherein the crystalline oxide semiconductor contains at least gallium.

[5] The semiconductor device according to [3], wherein the crystalline oxide semiconductor has a corundum structure or β-gallia structure.

[6] The semiconductor device according to [1], wherein a work function of the first electrode layer is greater than a work function of the second electrode layer.

[7] The semiconductor device according to [1], wherein the electric field relaxation region and an outer edge portion of the second electrode layer overlap in a plan view.

[8] The semiconductor device according to [1], wherein the semiconductor layer has an uneven portion on at least a part of a surface of the semiconductor layer located outside the outer edge portion of the first electrode layer.

[9] The semiconductor device according to [1], wherein the semiconductor layer has an uneven portion on at least a part of a surface of the semiconductor layer located at an outer edge portion of the second electrode layer.

[10] The semiconductor device according to [8] or [9], wherein the uneven portion includes a trench.

[11] The semiconductor device according to [1], further including a passivation film covering an interface between the outer edge portion of the second electrode layer and the semiconductor layer.

[12] The semiconductor device according to [1], wherein an insulator layer is provided between the semiconductor layer and the electrode layer.

[13] The semiconductor device according to [12], wherein at least a portion of the electric field relaxation region overlaps with an inner edge portion of the insulator layer in a plan view.

[14] The semiconductor device according to [12], wherein the insulator layer has an uneven portion at an interface between the second electrode layer and the insulator layer.

[15] The semiconductor device according to [14], wherein the uneven portion of the insulator layer includes a trench.

[16] The semiconductor device according to [15], wherein the electric field relaxation region has a portion overlapping with the trench in a plan view.

[17] The semiconductor device according to [12], further including a passivation film covering an interface between an outer edge portion of the second electrode layer and the insulator layer.

[18] The semiconductor device according to [1], wherein the semiconductor device includes a diode or a transistor.

[19] The semiconductor device according to [1], wherein the semiconductor device includes a power device.

[20] A power converter employing the semiconductor device according to [1].

[21] A control system employing the semiconductor device according to [1].

According to the disclosure, it is possible to provide the semiconductor device having improved reverse breakdown voltage and enhanced adhesion of the electrodes.

BRIEF DESCRIPTION OF DRAWINGS

FIG. 9 is a schematic cross-sectional view illustrating a metal oxide semiconductor field-effect transistor (MOSFET) according to one or more embodiments of a semiconductor device of the disclosure.

DETAILED DESCRIPTION

Figure 1:
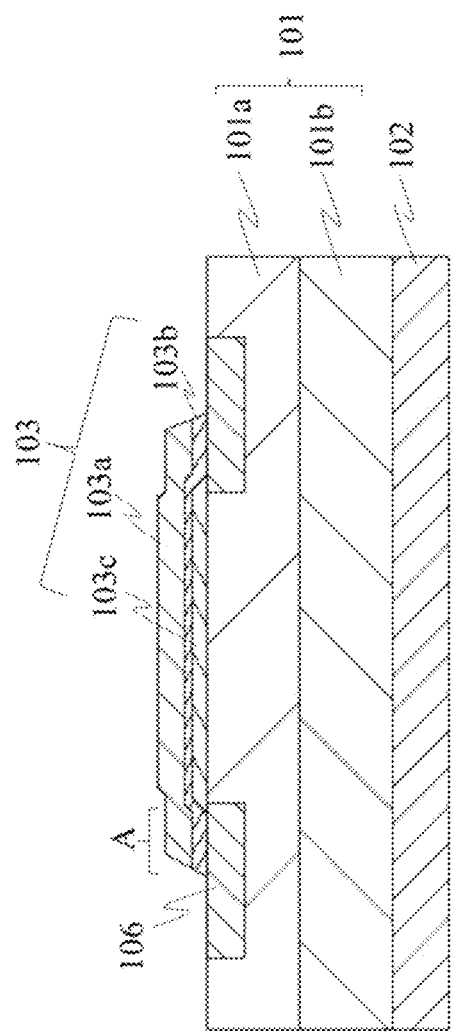
FIG. 1 is a schematic cross-sectional view illustrating a Schottky barrier diode (SBD) according to one or more embodiments of a semiconductor device of the disclosure.

The semiconductor device according to one or more embodiments of the disclosure includes a semiconductor layer and an electrode layer provided on the semiconductor layer and including a first electrode layer and a second electrode layer provided on the first electrode layer, wherein an outer edge portion of the second electrode layer is located outside an outer edge portion of the first electrode layer, wherein the semiconductor layer includes an electric field relaxation region with a different electrical resistivity from the semiconductor layer, and wherein the electric field relaxation region overlaps at least a part of a portion of the second electrode layer located outside the outer edge portion of the first electrode layer in a plan view.

The semiconductor layer is not particularly limited as long as it does not deviate the object of the disclosure. The constituent materials of the semiconductor layer may be silicon, silicon carbide, nitride semiconductors such as gallium nitride and aluminum nitride, gallium oxide and the like. In one or more embodiments of the disclosure, it is preferable that the semiconductor layer contains a crystalline oxide semiconductor as a major component. Examples of the crystalline oxide semiconductor include metal oxides containing one or more kinds of metals selected from aluminum, gallium, indium, iron, chromium, vanadium, titanium, rhodium, nickel, cobalt and iridium. In one or more embodiments of the disclosure, it is preferable that the crystalline oxide semiconductor contains at least one metal selected from aluminum, indium, and gallium, more preferably at least gallium, and most preferably α-$Ga_2O_3$ or a mixed crystal thereof. In one or more embodiments of the disclosure, even when a semiconductor having a large band gap, such as gallium oxide or mixed crystal including thereof, is used, enhanced adhesion of the electrode can be obtained while improving breakdown voltage. Crystal structure of the crystalline oxide semiconductor is not particularly limited as long as it does not deviate the object of the disclosure. The crystal structure of the crystalline oxide semiconductor may be corundum structure β-gallia structure, hexagonal structure (ε-type structure, etc.), orthogonal structure (κ-type structure, etc.), cubic structure, or tetragonal structure or the like. In one or more embodiments of the disclosure, the crystalline oxide semiconductor preferably has corundum structure, β-gallia structure, or hexagonal crystal structure such as ε-type structure, and more preferably corundum structure. Note that the term "main component" means that the atomic ratio of the crystalline oxide semiconductor to all components of the semiconductor layer is preferably 50% or more, more preferably 70% or more, and even more preferably 90% or more, and may be 100%. A thickness of the semiconductor layer is not particularly limited. The thickness of the semiconductor layer may be 1 μm or less, or may be 1 μm or more. In one or more embodiments of the disclosure, the thickness of the semiconductor layer is preferably 10 μm or more. The surface area of the semiconductor layer is not particularly limited, and the surface area of the semiconductor layer may be 1 $mm^2$ or more or 1 $mm^2$ or less. In one or more embodiments of the disclosure, the surface area of the semiconductor layer is preferably 10 $mm^2$~300 $cm^2$, and more preferably 100 $mm^2$~100 $cm^2$. The semiconductor layer is typically of a single crystal, but may be of polycrystalline. The semiconductor layer is a multilayer structure including at least a first semiconductor layer and a second semiconductor layer. When the Schottky electrode is provided on the first semiconductor layer, the multilayer structure may also be preferable such that the carrier density of the first semiconductor layer is smaller than the carrier density of the second semiconductor layer.

Here, the second semiconductor layer usually contains a dopant, and the carrier density of the semiconductor layer can be appropriately set by adjusting the doping amount of the dopant. The semiconductor layer preferably contains a dopant. Material of the dopant is not particularly limited and known dopant materials may be applied. In one or more embodiments of the disclosure, particularly when the semiconductor layer contains a crystalline oxide containing gallium as a main component, suitable examples of the dopant include an n-type dopant such as tin, germanium, silicon, titanium, zirconium, vanadium, or niobium, or a p-type dopant such as magnesium, calcium, or zinc. In one or more embodiments of the disclosure, the n-type dopant is preferably tin, germanium or silicon. The content of the dopant in the composition of the semiconductor layer is preferably 0.00001 atomic % or more, more preferably 0.00001 atomic % to 20 atomic %, and most preferably 0.00001 atomic % to 10 atomic %. More specifically, the concentration of the dopant in the semiconductor layer may typically be about $1\times10^{16}/cm^3$~$1\times10^{22}/cm^3$, or may be as low as, for example, about $1\times10^{17}/cm^3$ or less. According to one or more embodiments of the disclosure, the semiconductor layer may contain dopants at high concentrations of about $1\times10^{20}/cm^3$ or more. In one or more embodiments of the disclosure, it is preferable that the semiconductor layer contains a dopant at a concentration of $1\times10^{17}/cm^3$ or more.

In one or more embodiments of the disclosure, it is preferable that the semiconductor layer has an uneven portion on at least a part of the surface of the semiconductor layer located outside the outer edge portion of the first electrode layer. In one or more embodiments of the disclosure, it is preferable that at least a part of the uneven portion is located outside the outer edge portion of the second electrode layer. As a result, it makes possible to suppress the leakage current more favorably. The uneven portion is not particularly limited as long as it is formed of a convex portion and a concave portion. The uneven portion may be formed of only concave portions, only convex portions, or both concave and convex portions.

In one or more embodiments of the disclosure, the surface roughness (Ra) of the uneven portion is typically larger than the surface roughness (Ra) of the surface of the semiconductor layer other than the uneven portion. More specifically, for example, in the surface of the semiconductor layer, it is preferable that the surface roughness (Ra) of the outer side of the outer edge portion of the first electrode layer is larger than the surface roughness (Ra) of the inner side of the outer edge portion of the first electrode layer. In one or more embodiments of the disclosure, it is preferable that the uneven portion includes a trench, and at least a part of the second electrode layer is embedded in the trench. It makes possible to further improve the adhesion of the electrode, and to further improve the heat dissipation.

The method of forming the uneven portion is not particularly limited, and may be a known method. As a method of forming the uneven portion, a method of arranging a mask pattern on the surface of the semiconductor layer, and thereafter etching the semiconductor layer by plasma treatment in which a gas containing chlorine or fluorine is introduced, a method of irradiating argon (Ar), or the like can be given. The depth of the trench is not particularly limited, and in one or more embodiments of the disclosure, it is preferably 10 nm or more, and more preferably 100 nm or more.

Figure 11:
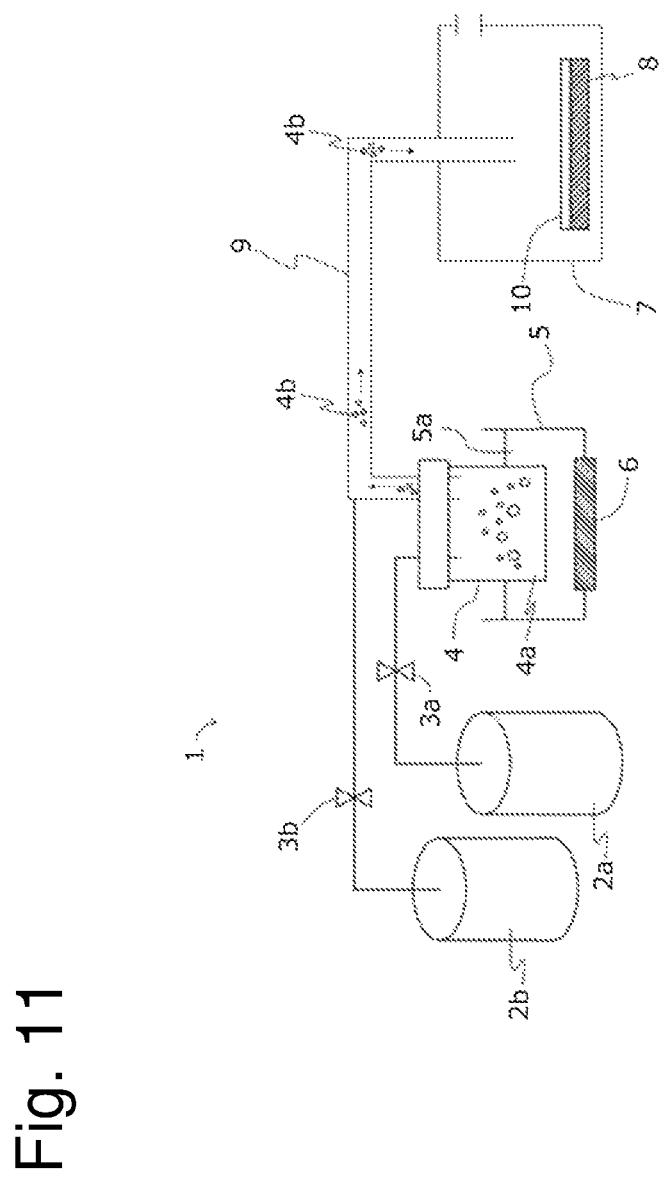
FIG. 11 is a diagram illustrating a mist CVD apparatus used for a semiconductor device according to one or more embodiments of the disclosure.

The semiconductor layer may be formed by using a known method. As a method for forming the semiconductor layer, CVD method, MOCVD method, MOVPE method, mist-CVD method, mist-epitaxy method, MBE method, HVPE method, pulsed growth method or ALD method, and the like. In one or more embodiments of the disclosure, the method of forming the semiconductor layer is preferable MOCVD method, mist CVD method, mist epitaxy method, or HVPE method, and preferably mist CVD method or mist epitaxy method. In the mist CVD method or the mist epitaxy method, for example, using a mist CVD apparatus shown in FIG. 11, droplets are floated by atomizing a raw material solution (atomizing step), and thereafter atomized droplets are conveyed to the vicinity of a substrate by a carrier gas (conveying step), and then a semiconductor film containing a crystalline oxide semiconductor as a main component is deposited on the substrate (deposition step) by thermally reacting the atomized droplets in the vicinity of the substrate, thereby forming the semiconductor layer on the substrate.

(Atomizing Step)

In the atomizing step, the raw material solution is atomized. The method of atomizing the raw material solution is not particularly limited as long as the raw material solution can be atomized, and may be a known method. In one or more embodiments of the disclosure, ultrasonic waves are preferably used as an atomization method. Droplets atomized using ultrasonic waves are preferred because they have an initial velocity of zero and are floated in the air. The droplet can be conveyed as a gas by floating in a space instead of being sprayed like a spray. It is very preferable because there is no damage due to collision energy. The size of the droplet is not particularly limited, and may be a droplet of about several millimeters, preferably 50 μm or less, and more preferably 100 nm to 10 μm.

(Raw Material Solution)

The raw material solution is not particularly limited as long as it is capable of atomization or droplet formation and contains a raw material capable of forming the semiconductor film. The raw material may be an inorganic material or an organic material. In one or more embodiments of the disclosure, the raw material is preferably a metal or a metal compound, and more preferably includes one or more metals selected from aluminum, gallium, indium, iron, chromium, vanadium, titanium, rhodium, nickel, cobalt and iridium.

In one or more embodiments of the disclosure, it is preferable to use a material in which the metal is dissolved or dispersed in an organic solvent or water in the form of a complex or a salt as the raw material solution. Examples of the form of the complex include an acetylacetonate complex, a carbonyl complex, an ammine complex, a hydride complex, and the like.

Examples of the form of the salt include an organometallic salt (metal acetate, metal oxalate, metal citrate, and the like), a metal sulfide salt, a nitrified metal salt, a phosphorylated metal salt, and a halogenated metal salt (metal chloride, metal bromide, metal iodide, and the like).

In the raw material solution, it is preferable to mix an additive such as a hydrohalic acid or an oxidizing agent. Examples of the hydrohalic acid include hydrobromic acid, hydrochloric acid, and hydroiodic acid. For the reason that the occurrence of abnormal grains can be more efficiently suppressed, hydrobromic acid or hydroiodic acid is more preferable. Examples of the oxidizing agent include peroxides such as hydrogen peroxide ($H_2O_2$), sodium peroxide ($Na_2O_2$), barium peroxide ($BaO_2$), and benzoyl peroxide ($(C_6H_5CO)_2O_2$), and organic peroxides such as hypochlorous acid (HClO), perchloric acid, nitric acid, ozone-water, peracetic acid and nitrobenzene.

A dopant may be contained in the raw material solution. By including a dopant in the raw material solution, doping can be performed well. Material for the dopant is not particularly limited as long as it does not deviate the object of the disclosure. Examples of the dopant include an n-type dopant such as tin, germanium, silicon, titanium, zirconium, vanadium, or niobium, or a p-type dopant such as Mg, H, Li, Na, K, Rb, Cs, Fr, Be, Ca, Sr, Ba, Ra, Mn, Fe, Co, Ni, Pd, Cu, Ag, Au, Zn, Cd, Hg, Ti, Pb, N, or P. The content of the dopant is appropriately set by referring to a calibration curve showing the relationship of the concentration of the dopant in the raw material with respect to the desired carrier density.

The solvent of the raw material solution is not particularly limited, and may be an inorganic solvent such as water, an organic solvent such as alcohol, or a mixed solvent of an inorganic solvent and an organic solvent. In one or more embodiments of the disclosure, the solvent preferably includes water, and more preferably, the solvent is water or a mixed solvent of water and alcohol.

(Conveying Step)

In the conveying step, the atomized droplets are conveyed into a deposition chamber using a carrier gas. The carrier gas is not particularly limited as long as it does not deviate the object of the disclosure, and examples thereof include an inert gas such as oxygen, ozone, nitrogen or argon, or a reducing gas such as hydrogen gas or a forming gas. The type of the carrier gas may be one, and two or more types may be accepted. A dilution gas (such as a 10-fold dilution gas) having a reduced flow rate may be further applied as the second carrier gas. The carrier gas may be supplied not only at one point but also at two or more points in the deposition chamber. The flow rate of the carrier gas is not particularly limited, and is preferably from 0.01 to 20 L/min, more preferably from 1 to 10 L/min. When the diluent gas is used, the flow rate of the diluent gas is preferably 0.001 to 2 L/min, more preferably 0.1 to 1 L/min.

(Deposition Step)

In the deposition step, the semiconductor film is deposited on the substrate by thermally reacting the atomized droplets in the vicinity of the substrate. The thermal reaction may be performed so long as the atomized droplets react with heat, and the reaction conditions and the like are not particularly limited as long as they do not deviate the object of the disclosure. In this deposition step, the thermal reaction is generally performed at a temperature equal to or higher than an evaporation temperature of the solvent, and in that case, a temperature (e.g., 1000° C. or less) which is not too high is preferable, and more preferably 650° C. or less, and most preferably 300° C. to 650° C. The thermal reaction may be carried out either under vacuum, under a non-oxygen atmosphere (under an inert gas atmosphere or the like), under a reducing gas atmosphere and under an oxygen atmosphere, as long as it does not deviate the object of the disclosure. Particularly, the thermal reaction is preferably carried out under an inert gas atmosphere or under an oxygen atmosphere. The deposition step may be performed under any condition under atmospheric pressure, under pressure, and under reduced pressure, in one or more embodiments of the disclosure, it is preferable that the deposition step is performed under atmospheric pressure. The film thickness can be set by adjusting the deposition time.

(Base)

The base is not particularly limited as long as it supports the semiconductor film. The material of the base is not particularly limited as long as it does not deviate the object of the disclosure, and may be a known material. The material of the base may be an organic compound, or may be an inorganic compound. The shape of the substrate may be of any shape. The shape may be a plate such as a flat plate or a disc plate, fibrous, rodlike, column, prismatic, cylindrical, spiral, spherical and ring-shape. In the disclosure, a base is preferably a substrate. In one or more embodiments of the disclosure, the shape of the substrate is preferably a plate. The thickness of the substrate is not particularly limited in one or more embodiments of the disclosure.

The substrate may be an insulator substrate or a semiconductor substrate. The substrate may be a metal substrate or a conductive substrate, and in particular, an insulator substrate is preferable. A substrate having a metal film on its surface is also preferable. Examples of the substrate include a base substrate containing a material having a corundum structure as a main component, a base substrate containing a material having β-gallia structure as a main component, and a base substrate containing a material having a hexagonal crystal structure as a main component. Here, the term "main component" means that the atomic ratio of the substrate material having the specific crystal structure to all components of the material constituting the substrate is preferably 50% or more, more preferably 70% or more, and still more preferably 90% or more, and may be 100%.

Materials for the substrate are not particularly limited as long as it does not deviate the object of the disclosure, and may be a known one. As the substrate having the corundum structure, it is preferable to employ a $\alpha$-$Al_2O_3$ (sapphire) substrate or a $\alpha$-$Ga_2O_3$ substrate, and more preferably an a-plane sapphire substrate, an m-plane sapphire substrate, an r-plane sapphire substrate, a c-plane sapphire substrate, or an $\alpha$-type gallium oxide substrate (a-plane, m-plane, or r-plane). As the base substrate containing the $\beta$-gallia-structured substrate material as a main component, $\beta$-$Ga_2O_3$ substrate, or a mixed crystal substrate containing $Ga_2O_3$ and $Al_2O_3$ in which $Al_2O_3$ is more than 0 wt % and 60 wt % or less may be selected for example. Examples of the base substrate containing the hexagonal-structured substrate material as a main component include a SiC substrate, a ZnO substrate and a GaN substrate.

According to one or more embodiments of the disclosure, annealing treatment may be performed after the deposition step. The temperature of the aforementioned annealing treatment is not limited especially unless deviating the object of the disclosure, and is generally 300° C. to 650° C., and is preferably 350° C. to 550° C. The processing time of the annealing treatment is generally in 1 minute to 48 hours, preferably in 10 minutes to 24 hours, and more preferably in 30 minutes to 12 hours. The annealing treatment may be performed under any atmosphere so long as it does not deviate the object of the disclosure. The atmosphere of the annealing treatment may be a non-oxygen atmosphere or an oxygen atmosphere. Examples of the non-oxygen atmosphere include an inert gas atmosphere (e.g., a nitrogen atmosphere) or a reducing gas atmosphere. In one or more embodiments of the disclosure, the non-oxygen atmosphere, preferably the inert gas atmosphere, more preferably the nitrogen atmosphere.

In one or more embodiments of the disclosure, the semiconductor film may be directly deposited on the substrate, or the semiconductor film may be deposited via another layer such as a stress relaxation layer (a buffer layer, an ELO layer, or the like), a release sacrifice layer, or the like. The method of forming each of the layers is not particularly limited, and may be a known method. In one or more embodiments of the disclosure, a method of forming each of the layers is preferably mist CVD method.

In one or more embodiments of the disclosure, the semiconductor film may be used in a semiconductor device as the semiconductor layer after the semiconductor film is peeled off from the base or the like by a known method, or the semiconductor film may be used in a semiconductor device as the semiconductor layer without being peeled off from the base or the like.

The electrode layer may include a first electrode layer and a second electrode layer which is disposed directly on the first electrode layer or with another layer interposed therebetween. In one or more embodiments of the disclosure, the electrode layer may form a Schottky junction with the semiconductor layer, or may form an ohmic junction with the semiconductor layer. The electrode layer may be applied to either a Schottky electrode, an ohmic electrode, a gated electrode, a drain electrode, a source electrode, a collector electrode, an emitter electrode, or the like. In one or more embodiments of the disclosure, it is preferable that the electrode layer constitutes the Schottky electrode or the source electrode. The electrode layer may further include another electrode layer or the like as a third electrode layer.

Unless the object of the disclosure is deviated, the first electrode layer is not particularly limited as long as it has electrical conductivity. The constituent material of the first electrode layer may be a conductive inorganic material or a conductive organic material. In one or more embodiments of the disclosure, the material of the first electrode is preferably a metal. Preferable examples of the metal include at least one metal selected from Groups 4 to 10 of the Periodic Table. Examples of the metal of Group 4 of the Periodic Table include titanium (Ti), zirconium (Zr), and hafnium (Hf). Examples of the metal of Group 5 of the Periodic Table include vanadium (V), niobium (Nb), and tantalum (Ta). Examples of the metal of Group 6 of the Periodic Table include chromium (Cr), molybdenum (Mo) and tungsten (W). Examples of the metal of Group 7 of the Periodic Table include manganese (Mn), technetium (Tc), and rhenium (Re). Examples of the metal of Group 8 of the Periodic Table include iron (Fe), ruthenium (Ru), and osmium (Os). Examples of the metal of Group 9 of the Periodic Table include cobalt (Co), rhodium (Rh), and iridium (Ir). Examples of the metal of Group 10 of the Periodic Table include nickel (Ni), palladium (Pd), and platinum (Pt). In one or more embodiments of the disclosure, the first electrode layer preferably includes at least one metal selected from Group 6 of the Periodic Table. The thickness of the first electrode layer is not particularly limited, and is preferably 0.1 nm to 10 µm, more preferably 5 nm to 500 nm, and most preferably 10 nm to 200 nm. In one or more embodiments of the disclosure, it is preferable that the thickness of the first electrode layer is thinner than the thickness of the second electrode layer. In one or more embodiments of the disclosure, it is preferable that the work function of the first electrode layer is larger than the work function of the second electrode layer. By such a configuration of the first electrode layer, it makes possible to obtain a semiconductor device having better Schottky characteristics. Further, it is possible to favorably improve the reverse breakdown voltage. In one or more embodiments of the disclosure, the first electrode layer may be a single layer or may be composed of two or more metal layers.

The second electrode layer is not particularly limited as long as the second electrode layer is a conductive layer placed on the first electrode layer, unless the object of the disclosure is deviated. The second electrode layer may be directly stacked on the first electrode layer or may be stacked via another layer such as a metal layer. The material constituting the second electrode layer may be a conductive inorganic material or a conductive organic material. In one or more embodiments of the disclosure, the material of the second electrode is preferably a metal. Preferable examples of the metal include at least one metal selected from Groups 4 to 13 of the Periodic Table. Examples of metals in Groups 4 to 10 of the Periodic Table include metals exemplified as the metals in Groups 4 to 10 of the Periodic Table in the above description of the first electrode layer. Examples of the metal of Group 11 of the Periodic Table include copper (Cu), silver (Ag), and gold (Au). Examples of the metal of Group 12 of the Periodic Table include zinc (Zn) and cadmium (Cd). Examples of the metal of Group 13 of the Periodic Table include aluminum (Al), gallium (Ga), and indium (In). In one or more embodiments of the disclosure, it is preferable that the second electrode layer contains at least one metal selected from Groups 4 and 10 of the Periodic Table, and more preferably, titanium (Ti) or platinum (Pt). The thickness of the second electrode layer is not particularly limited, and is preferably 1 nm to 500 μm, more preferably 10 nm to 100 μm, and most preferably 0.5 μm to 10 μm. In one or more embodiments of the disclosure, the second electrode layer may be a single layer or may be composed of two or more metal layers.

The method of forming the first electrode layer or the second electrode layer is not particularly limited, and may be a known method. Specific examples of the method of forming the first electrode or the second electrode layer include a dry method and a wet method. Examples of the dry method include sputtering, vacuum evaporation, and CVD. Examples of the wet method include screen printing and die coating.

The outer edge portion of the second electrode layer may be located outside the outer edge portion of the first electrode layer. In one or more embodiments of the disclosure, the adhesion can be further improved by setting the distance between the outer edge portion of the first electrode layer and the outer edge portion of the second electrode layer to 1 μm or more. In one or more embodiments of the disclosure, a portion of the second electrode layer that protrudes outward from the outer edge portion of the first electrode layer (hereinafter also referred to as "protruding portion") may, at least partially, have a tapered region in which thickness of the second electrode layer decreases toward the outer side of the semiconductor device. It makes possible to further improve breakdown voltage of the semiconductor device. By the combination of such an electrode configuration and the constituent material of the semiconductor layer described above, it makes possible to obtain a semiconductor device having a lower loss with the leakage current being favorably suppressed. The rate of change of the layer thickness in the tapered region is not particularly limited. When it can be said that the thickness of the tapered region decreases toward the outside of the semiconductor device from arbitrary two points of the inner film thickness and the outer film thickness, the region may be regarded as the tapered region for the sake of convenience.

The electric field relaxation region may be a region where the electrical resistivity thereof is different from that of the semiconductor layer. That is, the electric field relaxation region is sufficient if the electrical resistivity between the regions except the electric field relaxation region in the semiconductor layer is different. The constituent material of the electric field relaxation region is not particularly limited, and the main component of the electric field relaxation region and the semiconductor layer may be the same, or the main component of the electric field relaxation region and the semiconductor layer may be different. In one or more embodiments of the disclosure, the electric field relaxation region is preferably a high resistance region, a p-type semiconductor region, or an insulator region. When the electric field relaxation region is the high resistance region, the electric resistivity of the electric field relaxation region is generally $5.0 \times 10^4$ Ω·cm or more, preferably $1.0 \times 10^5$ Ω·cm or more. When the electric field relaxation region is the p-type semiconductor region, the electric field relaxation region and the semiconductor layer may have same main component, and the electric field relaxation region may contain a p-type dopant. The electric field relaxation region and the semiconductor layer may have different p-type semiconductor in respective main component. In one or more embodiments of the present invention, it is preferable that the electric field relaxation region and the outer edge portion of the second electrode layer overlap in a plan view. With such a constituent, it makes possible to further improve the breakdown voltage of the semiconductor device while maintaining the adhesion of the electrode.

In one or more embodiments of the disclosure, the semiconductor device further preferably has an insulator layer between the semiconductor layer and the electrode layer. In this case, at least a portion of the electric field relaxation region is more preferably overlapped in a plan view with the inner edge portion of the insulator layer. In this case, the outer edge portions of the first electrode layer and/or the second electrode layer are preferably located on the insulator layer, whereby a depletion layer is favorably formed in the semiconductor layer. In one or more embodiments of the disclosure, it is preferable that an outer edge portion of the first electrode layer and/or the second electrode layer and at least a part of the electric field relaxation region overlap with each other in a plan view. With such a configuration, it is further suppressed the breakdown of the insulator layer. The material constituting the insulator layer is not particularly limited as long as it does not deviate the object of the disclosure, and may be a known material. Examples of the insulator layer include a $SiO_2$ film, a polysilicon film, a phosphorus-added $SiO_2$ film (PSG film), a boron-added $SiO_2$ film, and a phosphorus-boron-added $SiO_2$ film (BPSG film). Examples of method for forming the field insulating film includes CVD method, atmospheric pressure CVD method, plasma CVD method, mist CVD method. In one or more embodiments of the disclosure, it is preferable that the method of forming the insulator layer is mist CVD method or atmospheric pressure CVD method.

In one or more embodiments of the disclosure, it is preferable that the insulator layer has an uneven portion at an interface in contact with the second electrode layer. The uneven portion may be the same configuration as the uneven portion of the semiconductor layer described above. In one or more embodiments of the disclosure, it is preferable that at least a part of the uneven portion is located outside the outer edge portion of the second electrode layer. In one or more embodiments of the disclosure, it is preferable that the uneven portion includes a trench, and at least a part of the second electrode layer is embedded in the trench. In this case, it is preferable that the electric field relaxation region has a portion overlapping with the trench in a plan view. With such a configuration, it makes possible to further improve the adhesion of the electrode while maintaining the improvement of the breakdown voltage of the semiconductor device. The depth of the trench is not particularly limited, and in one or more embodiments of the disclosure, it is preferably 10 nm or more, and more preferably 100 nm or more. In one or more embodiments of the disclosure, the semiconductor device may further include a passivation film covering an interface between an outer edge portion of the second electrode layer and the insulator layer.

The semiconductor device of one or more embodiments of the disclosure can be applied to various semiconductor elements, and among other things, it is useful for application to power devices. The semiconductor element can be classified as a lateral element, in which the electrodes are formed on one side of the semiconductor layer and current flows in the perpendicular direction of thickness of the semiconductor layer (lateral device), and a vertical element, in which the electrodes are formed on both front and back sides of the semiconductor layer and current flows in the direction of thickness of the semiconductor layer (vertical device). In one or more embodiments of the disclosure, the semiconductor element can be suitably used for both a lateral device and a vertical device, and among them, it is preferable to apply it for a vertical device. The semiconductor devices of the disclosure include Schottky barrier diodes (SBDs), metal semiconductor field effect transistors (MESFET), high electron mobility transistors (HEMT), metal oxide semiconductor field effect transistors (MOSFET), static induction transistors (SITs), junction field effect transistors (JFET), insulated gate bipolar transistors (IGBT) or light emitting diodes. In one or more embodiments of the disclosure, the semiconductor device is preferable an SBD, a MOSFET, a SIT, a JFET, or an IGBT, more preferably an SBD, a MOSFET, or a SIT, and most preferably an SBD.

Hereinafter, preferable embodiments of the semiconductor device will be described with reference to the drawings. In the semiconductor device explained hereinafter, unless deviating the object of the disclosure, further other layers (insulator layer, semi-insulator layer, conductor layer, semiconductor layer, buffer layer or another intermediate layer or the like) may be included, and a layer such as a buffer layer may be omitted as appropriate. The disclosure is not limited to the following embodiments.

FIG. 1 is a cross-sectional view illustrating a main portion of a Schottky barrier diode (SBD) as one of the preferred embodiments of the semiconductor device of the disclosure. SBD shown in FIG. 1 includes an ohmic electrode 102, a semiconductor layer 101, a Schottky electrode 103, an electric field relaxation region 106. The semiconductor layer 101 is composed of an n$^-$-type semiconductor layer 101a and an n$^+$-type semiconductor layer 101b. The Schottky electrode 103 is composed of a metal layers 103a, 103b and 103c. In the semiconductor device shown in FIG. 1, the outer edge portion of the metal layer 103a and/or the metal layer 103b constituting the second electrode layer is located outside the outer edge portion of the metal layer 103c constituting the first electrode layer. The semiconductor device of FIG. 1 includes the electric field relaxation region 106. The electric field relaxation region 106 overlaps at least a part of a portion A located outer side the outer edge portion of the first electrode layer of the second electrode layer in a plan view. With such a configuration, it makes possible to further improve the adhesion of the Schottky electrode while improving the reverse breakdown voltage of the semiconductor device. Furthermore, of the metal layer 103a and/or the metal layer 103b, the thickness of the portion protruding outward more than the outer edge portion of the metal layer 103c has a tapered region which decreases toward the outside of the semiconductor device. Therefore, in the case of covering the passivation film, the adhesiveness is improved, and the structure is excellent in characteristics of breakdown voltage and the environment resistance.

Examples of the constituent materials of the metal layers 103a and 103b include the above-mentioned metals exemplified as materials constituting the second electrode layer. Examples of the constituent material of the metal layer 103c include the above-mentioned metal exemplified as the material constituting the first electrode layer. The method of forming each layer shown in FIG. 1 is not particularly limited as long as it does not deviate the object of the disclosure, and may be a known method. Patterning by a photolithography method after deposition using vacuum deposition method, CVD method, sputtering method or various coating methods, or by a method of performing direct patterning using a printing technique or the like may be employed.

Figure 2:
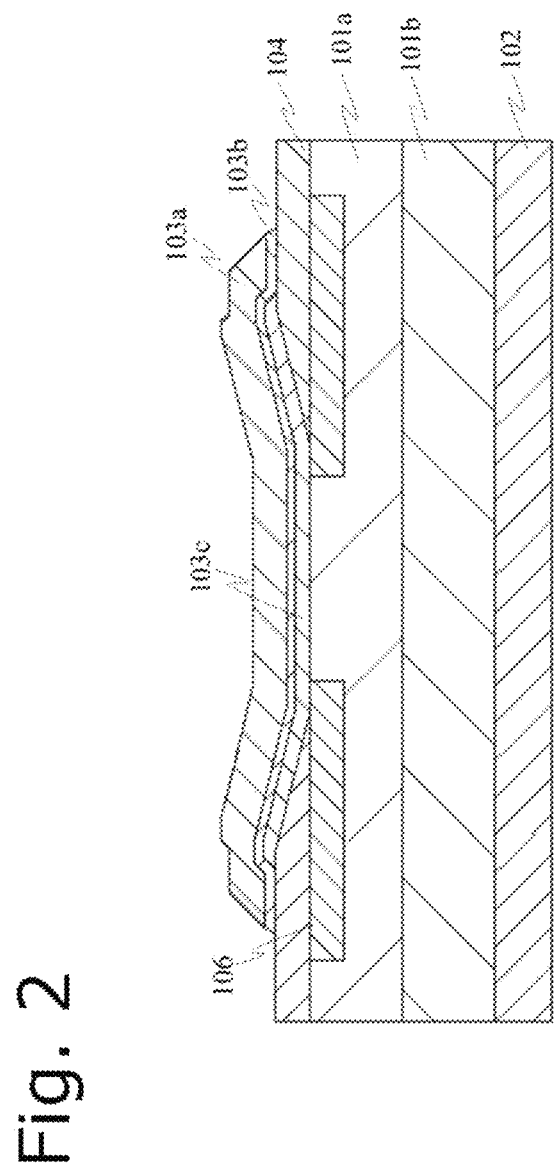
FIG. 2 is a schematic cross-sectional view illustrating a Schottky barrier diode (SBD) according to one or more embodiments of a semiconductor device of the disclosure.
Figure 7:
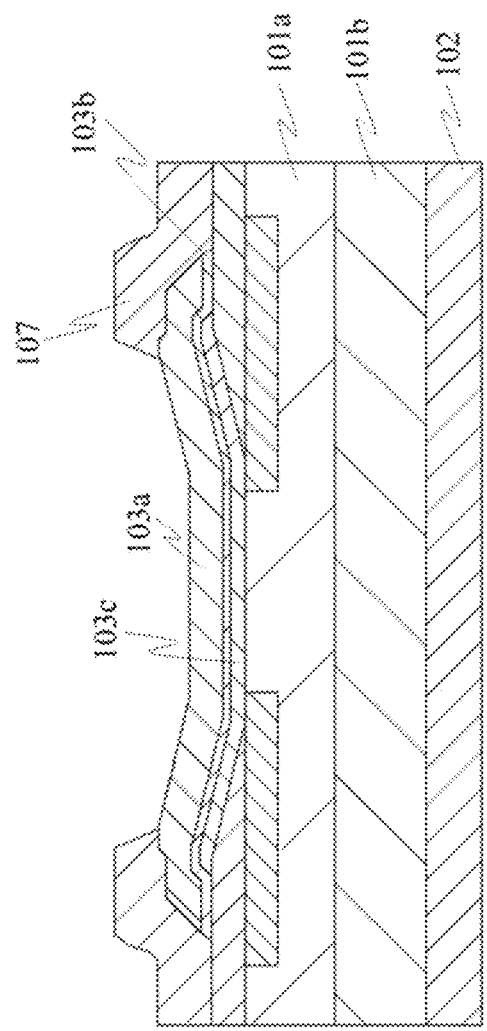
FIG. 7 is a schematic cross-sectional view illustrating a Schottky barrier diode (SBD) according to one or more embodiments of a semiconductor device of the disclosure.
Figure 16:
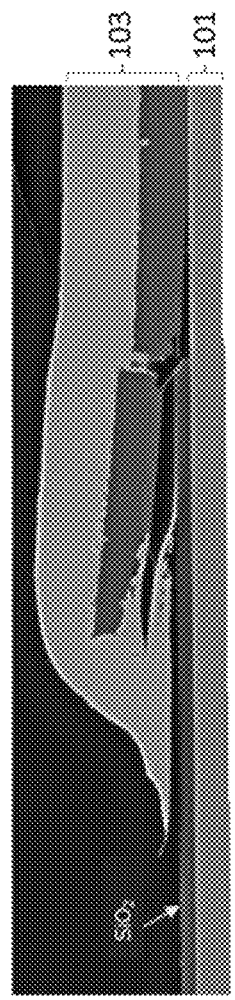
FIG. 16 is a cross-sectional image illustrating a Schottky barrier diode (SBD) after mounting process according to a comparative example.

FIG. 2 is a cross-sectional view illustrating a main part of a Schottky barrier diode (SBD) as another preferred embodiment of the semiconductor device of the disclosure. The SBD shown in FIG. 2 is different from the SBD shown in FIG. 1 such that the SBD of FIG. 2 further includes an insulator layer 104 as a field insulating film, and that outer edge portions of the metal layer 103a and/or the metal layer 103b overlap the insulator layer 104 and outer edge portions of the metal layer 103b overlap the electric field relaxation region 106 in a plan view. With such a configuration, it makes possible to further improve the breakdown voltage of the semiconductor device. In one or more embodiments of the disclosure, the outer edge portion of the metal layer 103a and/or the metal layer 103b serving as the second electrode layer is located outside the outer edge portion of the metal layer 103c serving as the first electrode layer. As a comparative example, when the semiconductor device is manufactured such that the outer edge portions of the metal layer 103a and/or the metal layer 103b are located on or inside the outer edge portions of the metal layer 103c, as shown in FIG. 16, peeling occurs between the Schottky electrode 103 and the semiconductor layer 101. This is applicant's new findings when considering implementation of gallium oxide (e.g., α-Ga$_2$O$_3$) as the semiconductor layer 101 to a semiconductor device. In addition to the SBD shown in FIG. 2, it is preferable to further include a passivation film 107, as shown in FIG. 7 for example, which covers the interface between the metal layer 103a and/or the metal layer 103b as the second electrode layer and the n$^-$-type semiconductor layer 101a. By further having the passivation film 107, it makes possible to suppress peeling off favorably not only of the first electrode layer but also of the second electrode layer.

The method of forming each layer shown in FIG. 2 is not particularly limited as long as it does not deviate the object of the disclosure, and may be a known method. Patterning by a photolithography method after deposition using vacuum deposition method, CVD method, sputtering method or various coating methods, or by a method of performing direct patterning using a printing technique or the like may be employed.

Figure 3:
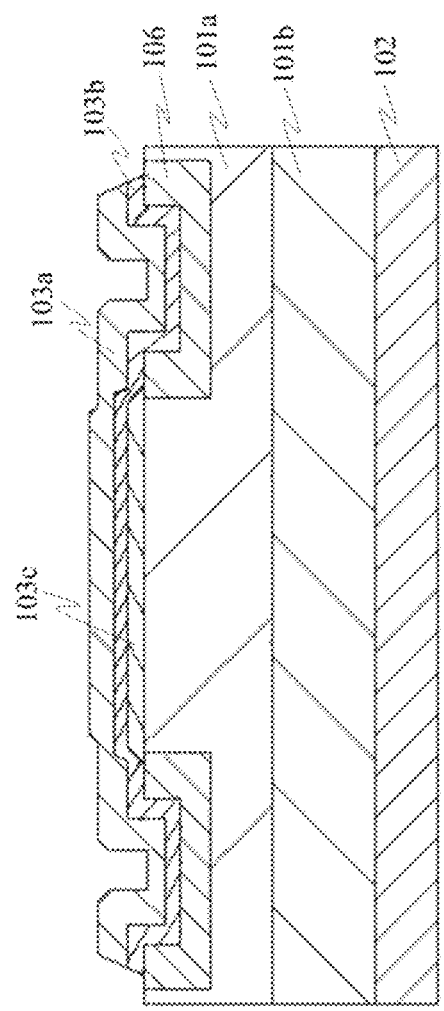
FIG. 3 is a schematic cross-sectional view illustrating a Schottky barrier diode (SBD) according to one or more embodiments of a semiconductor device of the disclosure.

FIG. 3 is a cross-sectional view illustrating a main part of a Schottky barrier diode (SBD) as another preferred embodiment of the semiconductor device of the disclosure. The SBD shown in FIG. 3 is different from the SBD shown in FIG. 1 such that the n$^-$-type semiconductor layer 101a has a trench (an uneven portion) in at least a part of the surface located outside the outer edge portion of the metal layer 103c as the first electrode layer. In the SBD of FIG. 3, a part of the metal layer 103a and/or the metal layer 103b as the second electrode layer is embedded in the trench (uneven portion), and the trench (uneven portion) and the electric field relaxation region 106 overlap in a plan view. With such a configuration, it makes possible to realize enhanced adhesion between the Schottky electrode 103 and the n$^-$-type semiconductor layer 101a, while maintaining improvement of the breakdown voltage.

The method of forming each layer shown in FIG. 3 is not particularly limited as long as it does not deviate the object of the disclosure, and may be a known method. Patterning by a photolithography method after deposition using vacuum deposition method, CVD method, sputtering method or various coating methods, or by a method of performing direct patterning using a printing technique or the like may be employed.

Figure 4:
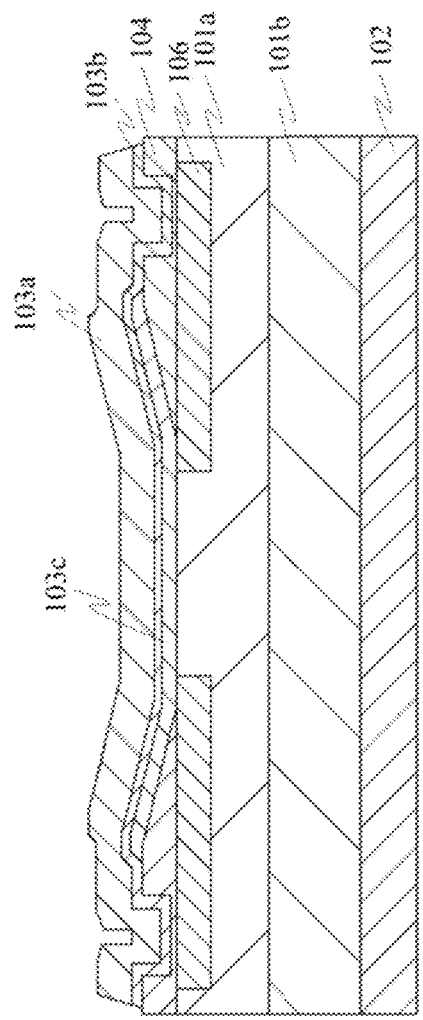
FIG. 4 is a schematic cross-sectional view illustrating a Schottky barrier diode (SBD) according to one or more embodiments of a semiconductor device of the disclosure.

FIG. 4 is a cross-sectional view illustrating a main part of a Schottky barrier diode (SBD) as another preferred embodiment of the semiconductor device of the disclosure. The SBD shown in FIG. 4 is different from the SBD shown in FIG. 3 such that the SBD has the insulator layer 104 as the field insulator film and the insulator layer 104 has a trench (uneven portion) at an interface where the metal layer 103b as the second electrode layer and the insulator layer 104 come into contact with each other. With such a configuration, it makes possible to realize enhanced adhesion between the Schottky electrode 103 and the insulator layer, while particularly maintaining improvement of the breakdown voltage by preventing breakdown of the insulator layer.

Hereinafter, the disclosure will be described in more detail with reference to preferred embodiments of manufacturing the semiconductor device shown in FIG. 4.

Figure 8A:
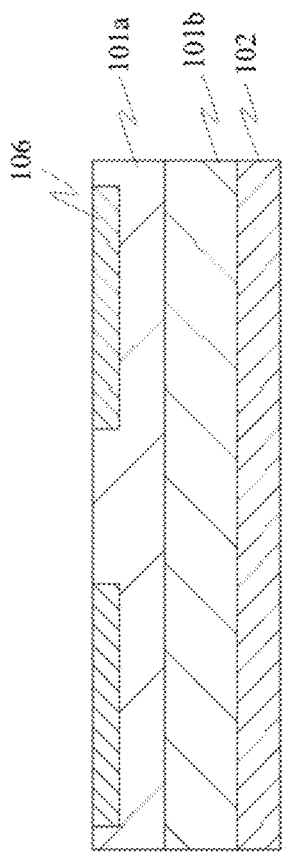
FIGS. 8A-8D are schematic cross-sectional views illustrating preferred manufacturing method of a Schottky barrier diode (SBD) according to one or more embodiments of a semiconductor device of the disclosure.
Figure 8B:
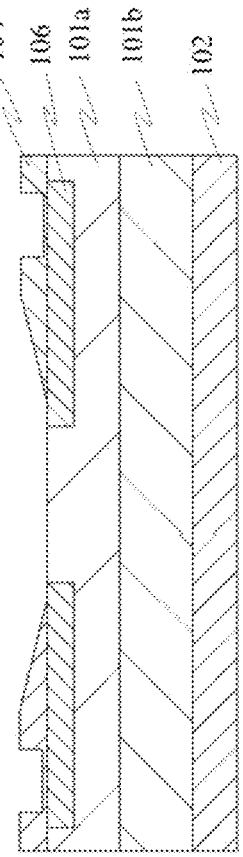
Figure 8C:
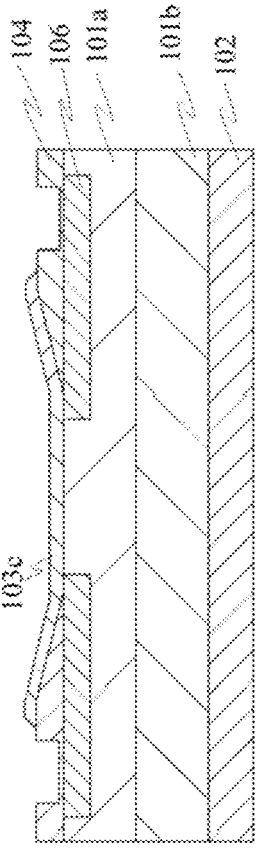
Figure 8D:
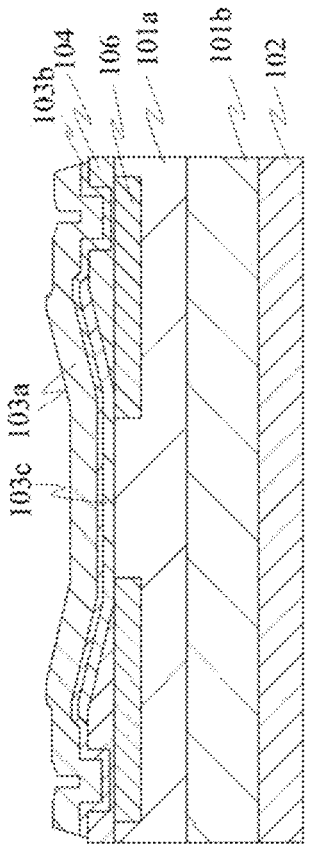

FIG. 8A shows a multilayer in which the n⁺-type semiconductor layer 101b and the n⁻-type semiconductor layer 101a are formed in this order on the ohmic electrode 102, and the electric field relaxation region 106 is formed in the n⁻-type semiconductor layer. The method of forming the electric field relaxation region 106 is not particularly limited as long as it does not deviate the object of the disclosure. As a method of forming the electric field relaxation region 106, for example, forming by ion implantation after the n⁻-type semiconductor layer 101a is formed, or forming by a vacuum deposition method, CVD method, sputtering method or the like after removing a portion of the n⁻-type semiconductor layer 101a by etching may be employed. Next, forming the insulator layer (field insulating film) 104 on the multilayer of FIG. 8A, and forming a trench in a portion of the insulator layer 104 using a known etching method are employed to obtain a laminate of FIG. 8B. The method of forming the field insulating film 104 is not particularly limited as long as it does not deviate the object of the disclosure. Examples of the method for forming the field insulating film 104 include sputtering method, vacuum deposition method, coating method, CVD method, atmospheric pressure CVD method, plasma CVD method, and mist CVD method, and in one or more embodiments of the disclosure, mist CVD method or atmospheric pressure CVD method is preferable. In the field insulating film 104, an opening for the first electrode layer is formed to expose at least a part of the n⁻-type semiconductor layer 101a. The method for forming the opening is not particularly limited, and may be a known etching method. The trench may be formed with this etching method in the same time, or by another method. By forming the trench inside of the electric field relaxation layer 106 in a plan view, it makes possible to improve the breakdown voltage. A tapered portion is formed in the field insulating film 104 such that the film thickness decreases from the outside to the inside of the semiconductor device. The method of forming the tapered portion is not particularly limited as long as it does not deviate the object of the disclosure, and may be a known method.

Next, the metal layer 103c is formed by using the dry method or the wet method and the photolithography method to obtain a multilayer shown in FIG. 3C. Next, the metal layers 103b and 103a are formed by using the dry method or the wet method to obtain a multilayer shown in FIG. 3D. Semiconductor device obtained as described above, the adhesion of the Schottky electrode is improved while the breakdown voltage is improved.

Figure 5:
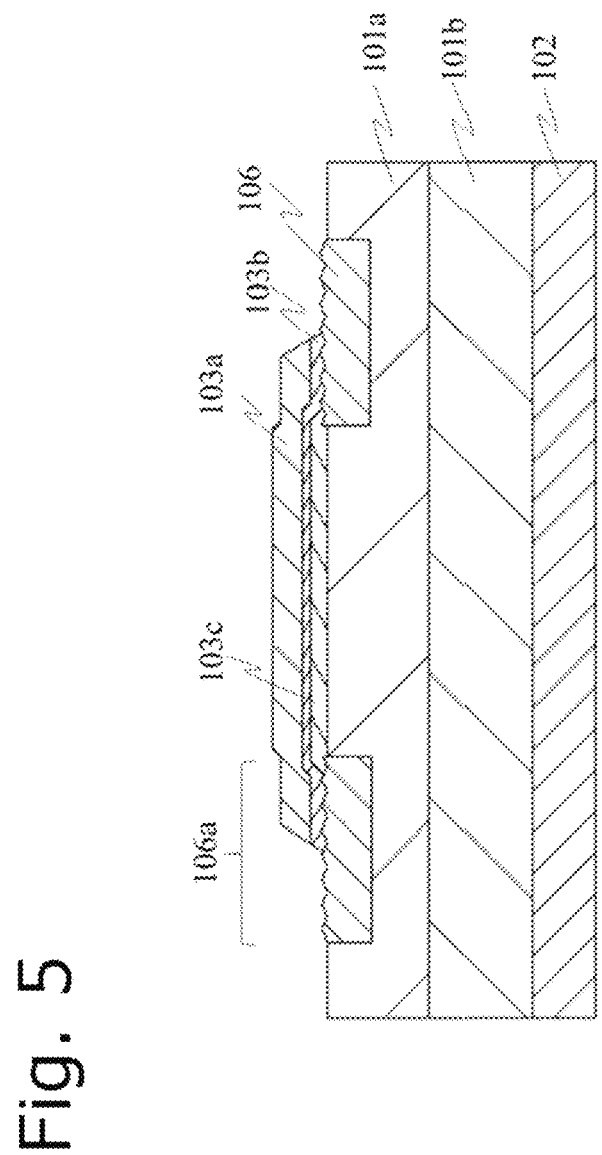
FIG. 5 is a schematic cross-sectional view illustrating a Schottky barrier diode (SBD) according to one or more embodiments of a semiconductor device of the disclosure.

FIG. 5 is a cross-sectional view illustrating a main part of a Schottky barrier diode (SBD) as another preferred embodiment of the semiconductor device of the disclosure. The SBD shown in FIG. 5 is different from the SBD shown in FIG. 1 such that the n⁻-type semiconductor layer 101a has an uneven portion 106a in at least a part of a surface located at an outer edge portion of the metal layer 103b as the second electrode layer. The uneven portion 106a is, for example, a region formed such that the surface roughness (Ra) of the uneven portion 106a is larger than that of the surface of the n⁻-type semiconductor layer 101a in contact with the metal layer 103c. In FIG. 5, the uneven portion 106a is provided such that the entire region of the upper surface of the electric field relaxation layer 106 has uneven shape. However, according to one or more embodiments of the disclosure, uneven shape may be formed only in the region of the metal layer 103b in contact with the electric field relaxation layer 106. The method of forming the uneven portion 106a is not particularly limited, and may be a known method. With such configuration of the SBD of FIG. 5, it makes possible to realize enhanced adhesion between the Schottky electrode 103 and the n⁻-type semiconductor layer 101a, while maintaining improvement of the breakdown voltage. Because at least a part of the uneven portion 106a in the SBD of FIG. 5 is located outside the outer edge portion of the metal layer 103a and/or 103b as the second electrode layer, the leakage current of the semiconductor device can be favorably suppressed.

The method of forming each layer shown in FIG. 5 is not particularly limited as long as it does not deviate the object of the disclosure, and may be a known method. Patterning by a photolithography method after deposition using vacuum deposition method, CVD method, sputtering method or various coating methods, or by a method of performing direct patterning using a printing technique or the like may be employed.

Figure 6:
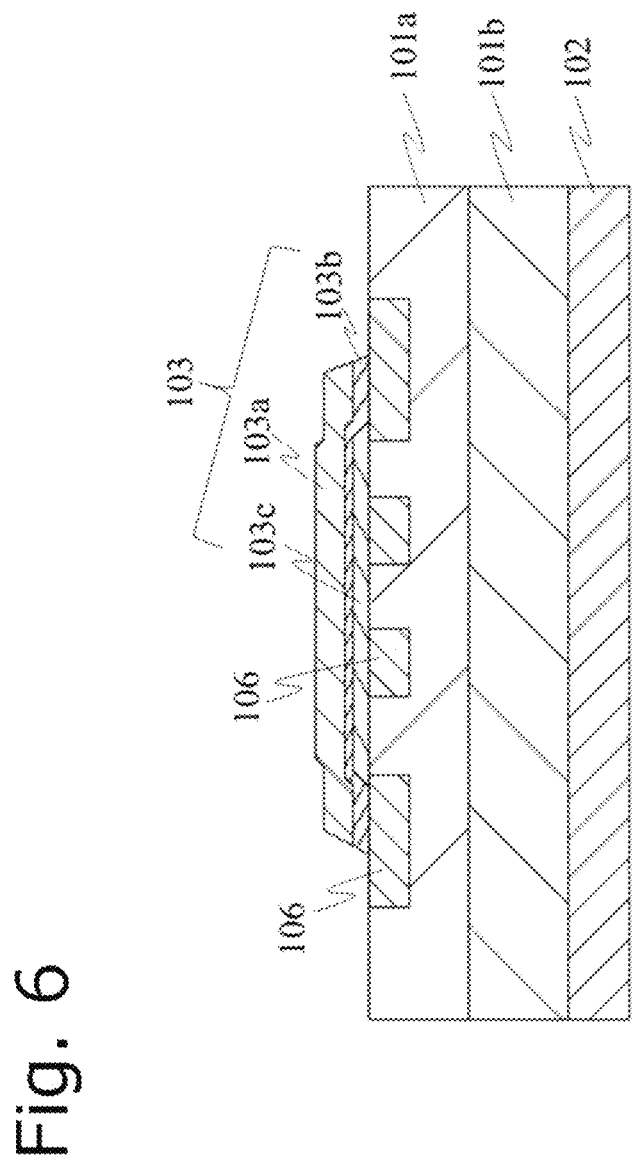
FIG. 6 is a schematic cross-sectional view illustrating a Junction barrier Schottky diode (JBS) according to one or more embodiments of a semiconductor device of the disclosure.

FIG. 6 is a cross-sectional view illustrating a main part of a junction barrier Schottky diode (JBS) as another preferred embodiment of the semiconductor device of the disclosure. The JBS shown in FIG. 6 includes the ohmic electrode 102, the n⁻-type semiconductor layer 101a, the n⁺-type semiconductor layer 101b, the Schottky electrode 103, and the electric field relaxation region 106. The Schottky electrode 103 is composed of the metal layers 103a, 103b and 103c. In the semiconductor device of FIG. 6, the outer edge portion of the metal layer 103a and/or the metal layer 103b as the second electrode layer is located outside the outer edge portion of the metal layer 103c as the first electrode layer. In the semiconductor device of FIG. 6 includes the electric field relaxation region 106 which overlaps, in a plan view, at least a part of a portion of the second electrode layer located outside the outer edge portion of the first electrode layer in addition to the outer edge portion of the second electrode. The electric field relaxation region 106 includes at least two regions. In the semiconductor device of FIG. 6, the electric field relaxation region 106 is formed of a p-type semiconductor, and forms a PN junction with the n⁻-type semiconductor layer 101a.

The method of forming each layer shown in FIG. 6 is not particularly limited as long as it does not deviate the object of the disclosure, and may be a known method. Patterning by a photolithography method after deposition using vacuum deposition method, CVD method, sputtering method or various coating methods, or by a method of performing direct patterning using a printing technique or the like may be employed.

FIG. 9 is a cross-sectional view illustrating a main part of a metal oxide film semiconductive field-effect transistor (MOSFET) as another preferred embodiment of the disclosure. MOSFET shown in FIG. 9 includes a drain electrode 202, an n⁻-type semiconductor layer 201a, a first n⁺-type semiconductor layer 201b, a second n⁺-type semiconductor layer 201c, a p-type semiconductor layer 201d, an electric field relaxation region 206, an insulator layer (an interlayer insulating film) 204, a gate electrode 205, metallic layers 203a, 203b, and 203c as source electrodes, and a gate insulating film 207. In the semiconductor device of FIG. 9, the outer edge portion of the metal layer 203*a* and/or the metal layer 203*b* as the second electrode layer is located outside the outer edge portion of the metal layer 203*c* as the first electrode layer. The electric field relaxation region 206 of the semiconductor device shown in FIG. 9 overlaps with at least a part of a portion of the second electrode layer located outside the outer edge portion of the first electrode layer in a plan view. In the semiconductor device shown in FIG. 9, the electric field relaxation region 206 is constituted by a p-type semiconductor. With such a configuration, it makes possible to further improve the adhesion of the source electrode while improving the reverse breakdown voltage of the semiconductor device.

Figure 10:
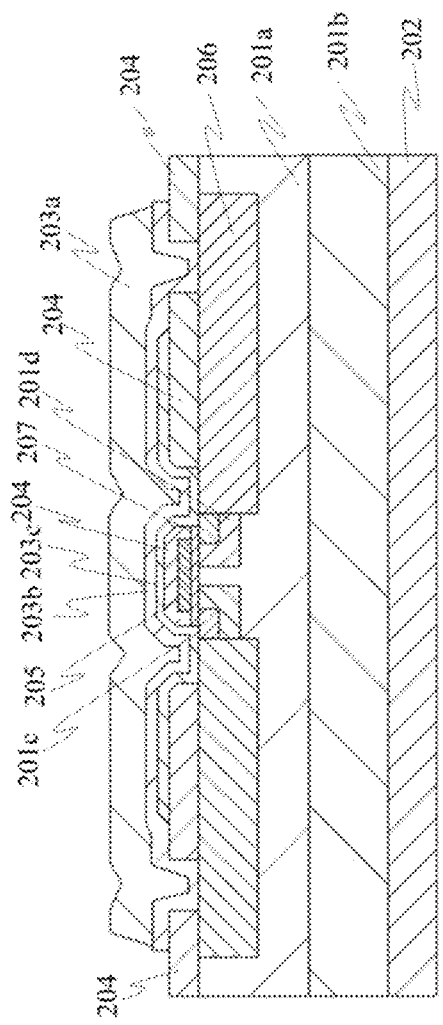
FIG. 10 is a schematic cross-sectional view illustrating a metal oxide semiconductor field-effect transistor (MOSFET) according to one or more embodiments of a semiconductor device of the disclosure.

FIG. 10 is a cross-sectional view illustrating a main portion of a metal-oxide-semiconductor field-effect transistor (MOSFET) as another preferred embodiment of the disclosure. MOSFET shown in FIG. 10 is different from MOSFET shown in FIG. 9 such that the insulator layer (interlayer insulating film) 204 has trenches (uneven portions) and the metal layers 203*a* and 203*b* (second electrode layers) are embedded in the trenches. With such a configuration, it makes possible to realize enhanced adhesion of the electrode, and to further improve the heat dissipation.

The method of forming each layer shown in FIGS. 9 and 10 is not particularly limited as long as it does not deviate the object of the disclosure, and may be a known method. Patterning by a photolithography method after deposition using vacuum deposition method, CVD method, sputtering method or various coating methods, or by a method of performing direct patterning using a printing technique or the like may be employed.

The semiconductor device according to one or more embodiments of the disclosure is particularly useful for a power device. As the semiconductor device, a diode (PN diode, Schottky barrier diode, junction barrier Schottky diode, etc.) or a transistor (such as a MOSFET, MESFET) and the like are given as examples.

Figure 12:
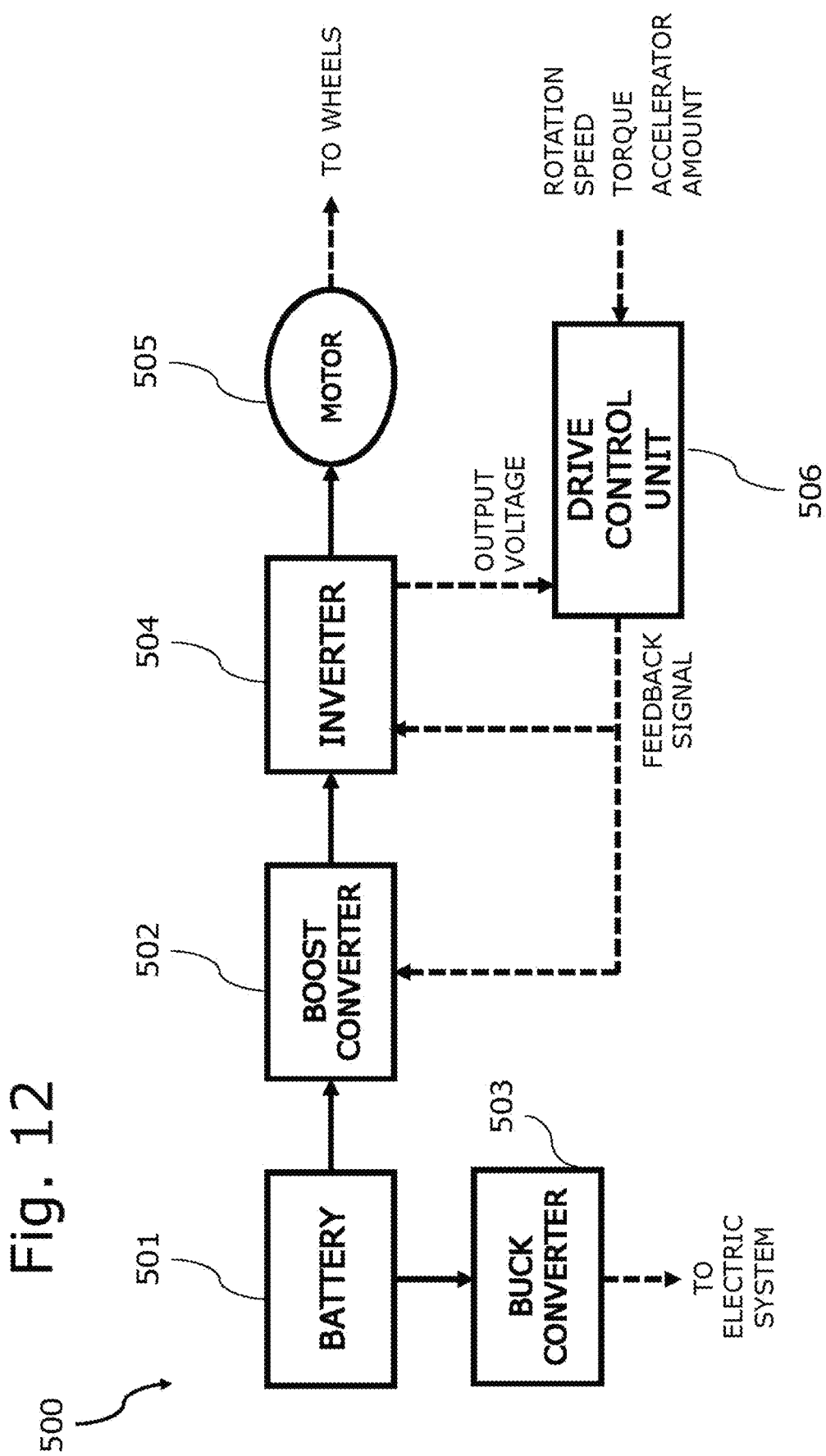
FIG. 12 is a block diagram illustrating an example of a control system employing a semiconductor device according to one of more embodiments of the disclosure.
Figure 13:
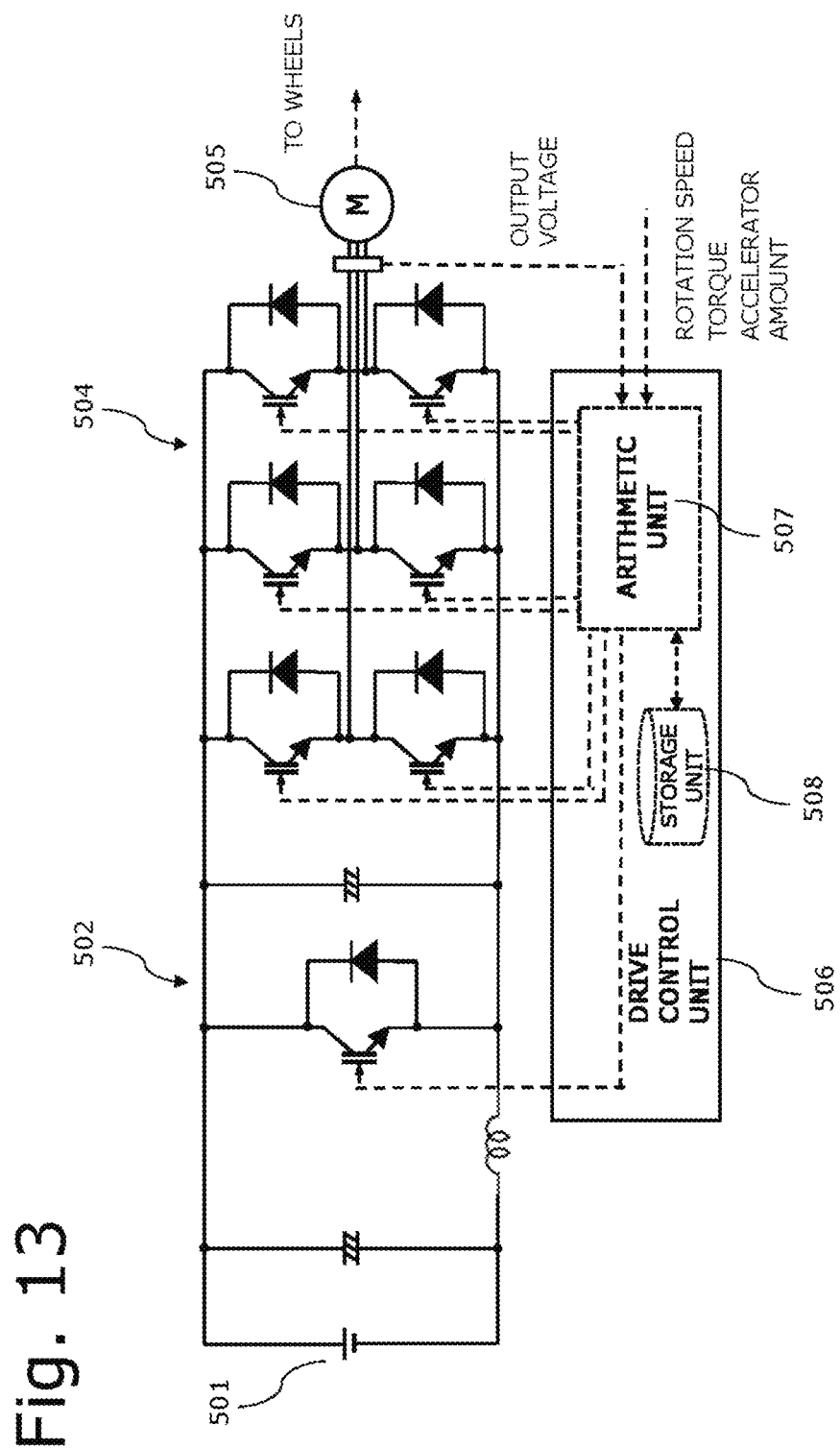
FIG. 13 is a circuit diagram illustrating an example of a control system employing a semiconductor device according to one of more embodiments of the disclosure.

In order to exhibit the functions described above, the semiconductor device of the disclosure described above can be applied to a power converter such as an inverter or a converter. More specifically, it can be applied as a diode incorporated in the inverter or converter, a thyristor, a power transistor, an IGBT (Insulated Gate Bipolar Transistor), a MOSFET (Metal-Oxide-Semiconductor Field Effect Transistor or the like as a switching element. FIG. 12 is a block diagram illustrating an exemplary control system applying a semiconductor device according to an embodiment of the disclosure, and FIG. 13 is a circuit diagram of the control system particularly suitable for applying to a control system of an electric vehicle.

As shown in FIG. 12, the control system 500 includes a battery (power supply) 501, a boost converter 502, a buck converter 503, an inverter 504, a motor (driving object) 505, a drive control unit 506, which are mounted on an electric vehicle. The battery 501 consists of, for example, a storage battery such as a nickel hydrogen battery or a lithium-ion battery. The battery 501 can store electric power by charging at the power supply station or regenerating at the time of deceleration, and to output a direct current (DC) voltage required for the operation of the driving system and the electrical system of the electric vehicle. The boost converter 502 is, for example, a voltage converter in which a chopper circuit is mounted, and can step-up DC voltage of, for example, 200V supplied from the battery 501 to, for example, 650V by switching operations of the chopper circuit. The step-up voltage can be supplied to a traveling system such as a motor. The buck converter 503 is also a voltage converter in which a chopper circuit is mounted, and can step-down DC voltage of, for example, 200V supplied from the battery 501 to, for example, about 12V. The step-down voltage can be supplied to an electric system including a power window, a power steering, or an electric device mounted on a vehicle.

The inverter 504 converts the DC voltage supplied from the boost converter 502 into three-phase alternating current (AC) voltage by switching operations, and outputs to the motor 505. The motor 505 is a three-phase AC motor constituting the traveling system of an electric vehicle, and is driven by an AC voltage of the three-phase output from the inverter 504. The rotational driving force is transmitted to the wheels of the electric vehicle via a transmission mechanism (not shown).

On the other hand, actual values such as rotation speed and torque of the wheels, the amount of depression of the accelerator pedal (accelerator amount) are measured from an electric vehicle in cruising by using various sensors (not shown), The signals thus measured are input to the drive control unit 506. The output voltage value of the inverter 504 is also input to the drive control unit 506 at the same time. The drive control unit 506 has a function of a controller including an arithmetic unit such as a CPU (Central Processing Unit) and a data storage unit such as a memory, and generates a control signal using the inputted measurement signal and outputs the control signal as a feedback signal to the inverters 504, thereby controlling the switching operation by the switching elements. The AC voltage supplied to the motor 505 from the inverter 504 is thus corrected instantaneously, and the driving control of the electric vehicle can be executed accurately. Safety and comfortable operation of the electric vehicle is thereby realized. In addition, it is also possible to control the output voltage to the inverter 504 by providing a feedback signal from the drive control unit 506 to the boost converter 502.

FIG. 13 is a circuit configuration excluding the buck converter 503 in FIG. 12, in other words, a circuit configuration showing a configuration only for driving the motor 505. As shown in the FIG. 13, the semiconductor device of the disclosure is provided for switching control by, for example, being applied to the boost controller 502 and the inverter 504 as a Schottky barrier diode. The boost converter 502 performs chopper control by incorporating the semiconductor device into the chopper circuit of the boost converter 502. Similarly, the inverter 504 performs switching control by incorporating the semiconductor device into the switching circuit including an IGBT of the inverter 504. The current can be stabilized by interposing an inductor (such as a coil) at the output of the battery 501. Also, the voltage can be stabilized by interposing a capacitor (such as an electrolytic capacitor) between each of the battery 501, the boost converter 502, and the inverter 504.

As indicated by a dotted line in FIG. 13, an arithmetic unit 507 including a CPU (Central Processing Unit) and a storage unit 508 including a nonvolatile memory are provided in the drive control unit 506. Signal input to the drive control unit 506 is given to the arithmetic unit 507, and a feedback signal for each semiconductor element is generated by performing the programmed operation as necessary. The storage unit 508 temporarily holds the calculation result by the calculation unit 507, stores physical constants and functions necessary for driving control in the form of a table, and outputs the physical constants, functions, and the like to the arithmetic unit 507 as appropriate. The arithmetic unit 507 and the storage unit 508 can be provided by a known configuration, and the processing capability and the like thereof can be arbitrarily selected.

As shown in FIGS. 12 and 13, a diode and a switching element such as a thyristor, a power transistor, an IGBT, a MOSFET and the like is employed for the switching operation of the boost converter 502, the buck converter 503 and the inverter 504 in the control system 500. The use of gallium oxide ($Ga_2O_3$) specifically corundum-type gallium oxide ($\alpha$-$Ga_2O_3$) as its materials for these semiconductor devices greatly improves switching properties. Further, extremely outstanding switching performance can be expected and miniaturization and cost reduction of the control system 500 can be realized by applying a semiconductor film or a semiconductor device of the disclosure. That is, each of the boost converter 502, the buck converter 503 and the inverter 504 can be expected to have the benefit of the disclosure, and the effect and the advantages can be expected in any one or combination of the boost converter 502, the buck converter 503 and the inverter 504, or in any one of the boost converter 502, the buck converter 503 and the inverter 504 together with the drive control unit 506.

The control system 500 described above is not only applicable to the control system of an electric vehicle with the semiconductor device of the disclosure, but can be applied to a control system for any applications such as to step-up and step-down the power from a DC power source, or convert the power from a DC to an AC. It is also possible to use a power source such as a solar cell as a battery.

Figure 14:
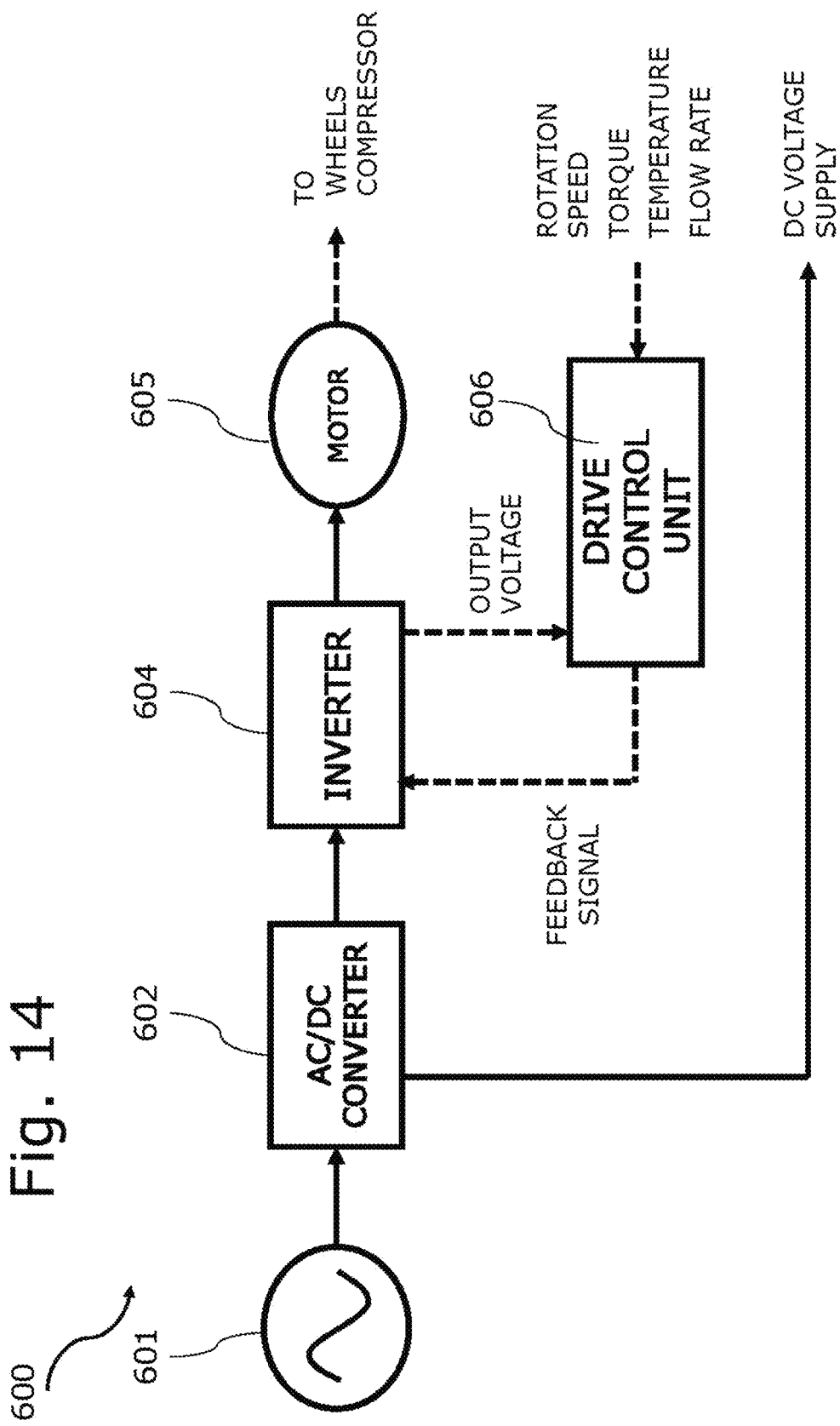
FIG. 14 is a block diagram illustrating an example of a control system employing a semiconductor device according to one of more embodiments of the disclosure.
Figure 15:
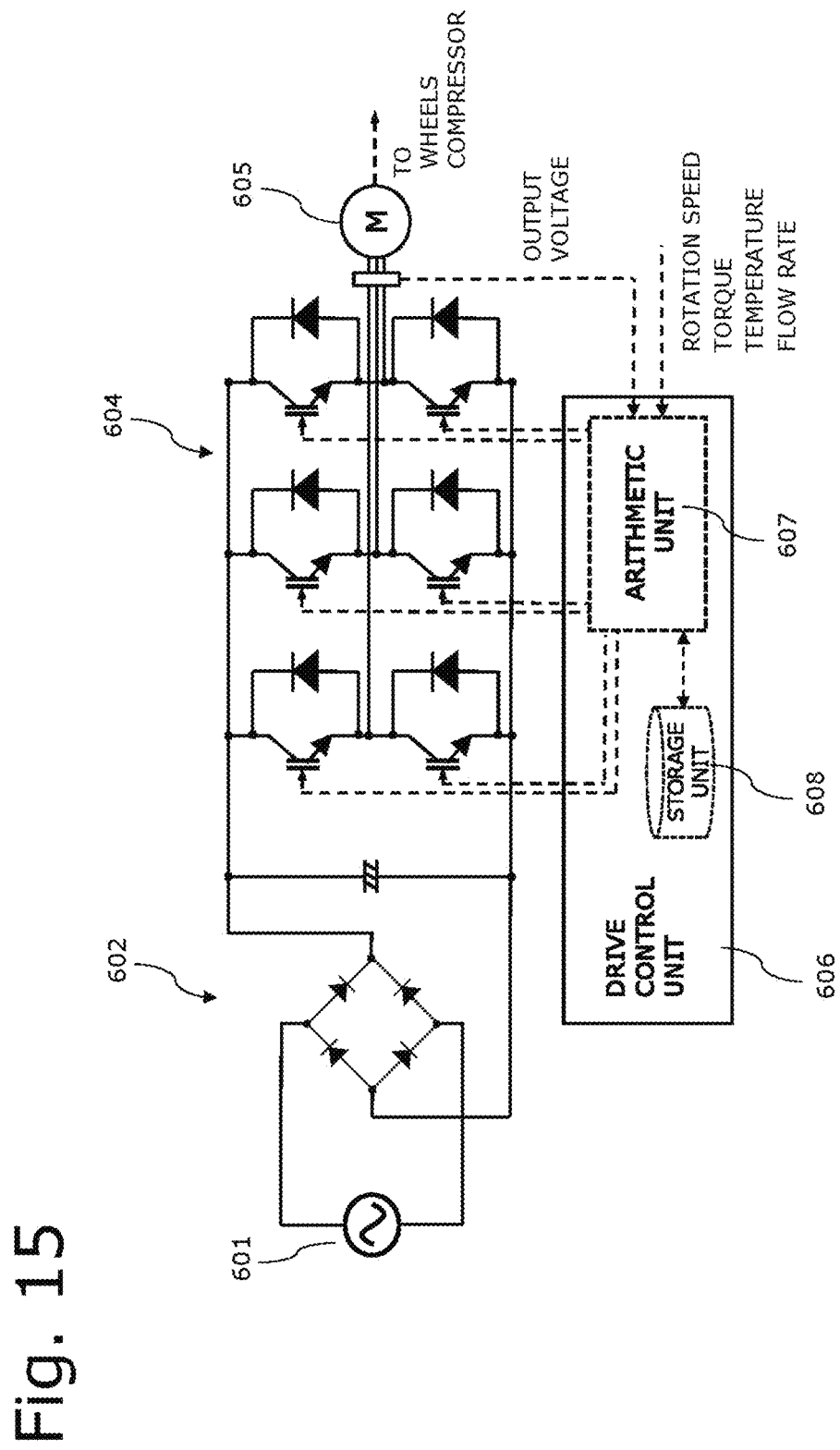
FIG. 15 is a circuit diagram illustrating an example of a control system employing a semiconductor device according to one of more embodiments of the disclosure.

FIG. 14 is a block diagram illustrating another exemplary control system applying a semiconductor device according to an embodiment of the disclosure, and FIG. 15 is a circuit diagram of the control system suitable for applying to infrastructure equipment and home appliances or the like operable by the power from the AC power source.

As shown in FIG. 14, the control system 600 is provided for inputting power supplied from an external, such as a three-phase AC power source (power supply) 601, and includes an AC/DC converter 602, an inverter 604, a motor (driving object) 605 and a drive control unit 606 that can be applied to various devices described later. The three-phase AC power supply 601 is, for example, a power plant (such as a thermal, hydraulic, geothermal, or nuclear plant) of an electric power company, whose output is supplied as an AC voltage while being downgraded through substations. Further, the three-phase AC power supply 601 is installed in a building or a neighboring facility in the form of a private power generator or the like for supplying the generated power via a power cable. The AC/DC converter 602 is a voltage converter for converting AC voltage to DC voltage. The AC/DC converter 602 converts AC voltage of 100V or 200V supplied from the three-phase AC power supply 601 to a predetermined DC voltage. Specifically, AC voltage is converted by a transformer to a desired, commonly used voltage such as 3.3V, 5V, or 12V. When the driving object is a motor, conversion to 12V is performed. It is possible to adopt a single-phase AC power supply in place of the three-phase AC power supply. In this case, same system configuration can be realized if an AC/DC converter of the single-phase input is employed.

The inverter 604 converts the DC voltage supplied from the AC/DC converter 602 into three-phase AC voltage by switching operations and outputs to the motor 605. Configuration of the motor 605 is variable depending on the control object. It can be a wheel if the control object is a train, can be a pump and various power source if the control objects a factory equipment, can be a three-phase AC motor for driving a compressor or the like if the control object is a home appliance. The motor 605 is driven to rotate by the three-phase AC voltage output from the inverter 604, and transmits the rotational driving force to the driving object (not shown).

There are many kinds of driving objects such as personal computer, LED lighting equipment, video equipment, audio equipment and the like capable of directly supplying a DC voltage output from the AC/DC inverter 602. In that case the inverter 604 becomes unnecessary in the control system 600, and a DC voltage from the AC/DC inverter 602 is supplied to the driving object directly as shown in FIG. 14. Here, DC voltage of 3.3V is supplied to personal computers and DC voltage of 5V is supplied to the LED lighting device for example.

On the other hand, rotation speed and torque of the driving object, measured values such as the temperature and flow rate of the peripheral environment of the driving object, for example, is measured using various sensors (not shown), these measured signals are input to the drive control unit 606. At the same time, the output voltage value of the inverter 604 is also input to the drive control unit 606. Based on these measured signals, the drive control unit 606 provides a feedback signal to the inverter 604 thereby controls switching operations by the switching element of the inverter 604. The AC voltage supplied to the motor 605 from the inverter 604 is thus corrected instantaneously, and the operation control of the driving object can be executed accurately. Stable operation of the driving object is thereby realized. In addition, when the driving object can be driven by a DC voltage, as described above, feedback control of the AC/DC controller 602 is possible in place of feedback control of the inverter.

FIG. 15 shows the circuit configuration of FIG. 14. As shown in FIG. 15, the semiconductor device of the disclosure is provided for switching control by, for example, being applied to the AC/DC converter 602 and the inverter 604 as a Schottky barrier diode. The AC/DC converter 602 has, for example, a circuit configuration in which Schottky barrier diodes are arranged in a bridge-shaped, to perform a direct-current conversion by converting and rectifying the negative component of the input voltage to a positive voltage. Schottky barrier diodes can also be applied to a switching circuit in IGBT of the inverter 604 to perform switching control. The voltage can be stabilized by interposing a capacitor (such as an electrolytic capacitor) between the AC/DC converter 602 and the inverter 604.

As indicated by a dotted line in FIG. 15, an arithmetic unit 607 including a CPU and a storage unit 608 including a nonvolatile memory are provided in the drive control unit 606. Signal input to the drive control unit 606 is given to the arithmetic unit 607, and a feedback signal for each semiconductor element is generated by performing the programmed operation as necessary. The storage unit 608 temporarily holds the calculation result by the arithmetic unit 607, stores physical constants and functions necessary for driving control in the form of a table, and outputs the physical constants, functions, and the like to the arithmetic unit 607 as appropriate. The arithmetic unit 607 and the storage unit 608 can be provided by a known configuration, and the processing capability and the like thereof can be arbitrarily selected.

In such a control system 600, similarly to the control system 500 shown in FIGS. 12 and 13, a diode or a switching element such as a thyristor, a power transistor, an IGBT, a MOSFET or the like is also applied for the purpose of the rectification operation and switching operation of the AC/DC converter 602 and the inverter 604. Switching performance can be improved by the use of gallium oxide ($Ga_2O_3$), particularly corundum-type gallium oxide ($\alpha$-$Ga_2O_3$), as materials for these semiconductor elements. Further, extremely outstanding switching performance can be expected and miniaturization and cost reduction of the control system 600 can be realized by applying a semiconductor film or a semiconductor device of the disclosure. That is, each of the AC/DC converter 602 and the inverter 604 can be expected to have the benefit of the disclosure, and the effects and the advantages of the disclosure can be expected in any one or combination of the AC/DC converter 602 and the inverter 604, or in any of the AC/DC converter 602 and the inverter 604 together with the drive control unit 606.

Although the motor 605 has been exemplified in FIGS. 14 and 15, the driving object is not necessarily limited to those that operate mechanically. Many devices that require an AC voltage can be a driving object. It is possible to apply the control system 600 as long as electric power is obtained from AC power source to drive the driving object. The control system 600 can be applied to the driving control of any electric equipment such as infrastructure equipment (electric power facilities such as buildings and factories, telecommunication facilities, traffic control facilities, water and sewage treatment facilities, system equipment, labor-saving equipment, trains and the like) and home appliances (refrigerators, washing machines, personal computers, LED lighting equipment, video equipment, audio equipment and the like).

The semiconductor device according to one or more embodiments of the disclosure can be applied to products of various technical fields such as a semiconductor (such as a compound semiconductor electronic device), electronic components and electrical equipment components, optical and electrophotographic related devices and industrial members. The semiconductor device according to one or more embodiment of the disclosure is particularly useful for a power device.

The invention claimed is:

1. A semiconductor device comprising:
    a semiconductor layer; and
    an electrode layer provided on the semiconductor layer and including a first electrode layer and a second electrode layer provided on the first electrode layer,
    wherein an outer edge portion of the second electrode layer is located outside an outer edge portion of the first electrode layer,
    wherein the semiconductor layer includes an electric field relaxation region with a different electrical resistivity from the semiconductor layer, and
    wherein the electric field relaxation region overlaps at least a part of a portion of the second electrode layer located outside the outer edge portion of the first electrode layer in a plan view.

2. The semiconductor device according to claim 1, wherein the semiconductor layer includes a crystalline oxide semiconductor as a main component.

3. The semiconductor device according to claim 2, wherein the crystalline oxide semiconductor contains one or more metals selected from aluminum, indium and gallium.

4. The semiconductor device according to claim 2, wherein the crystalline oxide semiconductor contains at least gallium.

5. The semiconductor device according to claim 3, wherein the crystalline oxide semiconductor has a corundum structure or a ß-gallia structure.

6. The semiconductor device according to claim 1, wherein a work function of the first electrode layer is greater than a work function of the second electrode layer.

7. The semiconductor device according to claim 1, wherein the electric field relaxation region and an outer edge portion of the second electrode layer overlap in a plan view.

8. The semiconductor device according to claim 1, wherein the semiconductor layer has an uneven portion on at least a part of a surface of the semiconductor layer located outside the outer edge portion of the first electrode layer.

9. The semiconductor device according to claim 1, wherein the semiconductor layer has an uneven portion on at least a part of a surface of the semiconductor layer located at an outer edge portion of the second electrode layer.

10. The semiconductor device according to claim 8, wherein the uneven portion includes a trench.

11. The semiconductor device according to claim 1, further comprising a passivation film covering an interface between the outer edge portion of the second electrode layer and the semiconductor layer.

12. The semiconductor device according to claim 1, wherein an insulator layer is provided between the semiconductor layer and the electrode layer.

13. The semiconductor device according to claim 12, wherein at least a portion of the electric field relaxation region overlaps with an inner edge portion of the insulator layer in a plan view.

14. The semiconductor device according to claim 12, wherein the insulator layer has an uneven portion at an interface between the second electrode layer and the insulator layer.

15. The semiconductor device according to claim 14, wherein the uneven portion of the insulator layer includes a trench.

16. The semiconductor device according to claim 15, wherein the electric field relaxation region has a portion overlapping with the trench in a plan view.

17. The semiconductor device according to claim 12, further comprising a passivation film covering an interface between an outer edge portion of the second electrode layer and the insulator layer.

18. The semiconductor device according to claim 1, wherein the semiconductor device includes a diode or a transistor.

19. The semiconductor device according to claim 1, wherein the semiconductor device includes a power device.

20. A power converter employing the semiconductor device according to claim 1.

21. A control system employing the semiconductor device according to claim 1.

\* \* \* \* \*